United States Patent
Or-Bach et al.

(10) Patent No.: US 10,679,977 B2
(45) Date of Patent: Jun. 9, 2020

(54) 3D MICRODISPLAY DEVICE AND STRUCTURE

(71) Applicant: Monolithic 3D Inc., San Jose, CA (US)

(72) Inventors: Zvi Or-Bach, San Jose, CA (US); Deepak C. Sekar, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 211 days.

(21) Appl. No.: 15/920,499

(22) Filed: Mar. 14, 2018

(65) Prior Publication Data

US 2018/0204826 A1    Jul. 19, 2018

Related U.S. Application Data

(63) Continuation-in-part of application No. 14/936,657, filed on Nov. 9, 2015, now Pat. No. 9,941,319, which (Continued)

(51) Int. Cl.
*H01L 27/146*   (2006.01)
*H01L 25/16*    (2006.01)

(Continued)

(52) U.S. Cl.
CPC ...... *H01L 25/167* (2013.01); *H01L 21/76254* (2013.01); *H01L 21/76275* (2013.01); *H01L 21/76283* (2013.01); *H01L 21/823878* (2013.01); *H01L 21/845* (2013.01); *H01L 24/16* (2013.01); *H01L 24/32* (2013.01); *H01L 24/83* (2013.01); *H01L 25/0756* (2013.01); *H01L 27/1218* (2013.01); *H01L 27/14603* (2013.01); *H01L 27/281* (2013.01); *H01L 33/382* (2013.01); *H01L 27/1211* (2013.01); *H01L 27/153* (2013.01); *H01L 33/0066* (2013.01); *H01L 33/06* (2013.01); *H01L 33/30* (2013.01);

(Continued)

(58) Field of Classification Search
CPC ............ H01L 27/281; H01L 31/02016; H01L 31/0248

See application file for complete search history.

(56) References Cited

U.S. PATENT DOCUMENTS 3,007,090 A   10/1961  Rutz
3,819,959 A    6/1974  Chang et al.
(Continued)

FOREIGN PATENT DOCUMENTS

EP           1267594 A2     12/2002
WO  PCT/US2008/063483      5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.

(Continued)

*Primary Examiner* — Cheung Lee
(74) *Attorney, Agent, or Firm* — Patent Law Office www.patenteoffice.io; Bao Tran

(57) ABSTRACT

A 3D micro display, the micro display including: a first single crystal layer including at least one LED driving circuit; and a second single crystal layer including a plurality of light emitting diodes (LEDs), where the second single crystal layer overlays the first single crystal layer, where the second single crystal layer includes at least ten first LED pixels, and where the second single crystal layer and the first single crystal layer are separated by a vertical distance of less than ten microns.

20 Claims, 33 Drawing Sheets

Related U.S. Application Data is a continuation-in-part of application No. 13/274,161, filed on Oct. 14, 2011, now Pat. No. 9,197,804, application No. 15/920,499, which is a continuation-in-part of application No. 12/904,103, filed on Oct. 13, 2010, now Pat. No. 8,163,581.

(51) Int. Cl.

| | | |
|---|---|---|
| *H01L 21/762* | (2006.01) | |
| *H01L 23/00* | (2006.01) | |
| *H01L 21/8238* | (2006.01) | |
| *H01L 21/84* | (2006.01) | |
| *H01L 33/38* | (2010.01) | |
| *H01L 25/075* | (2006.01) | |
| *H01L 27/12* | (2006.01) | |
| *H01L 27/28* | (2006.01) | |
| *H01L 33/32* | (2010.01) | |
| *H01L 33/06* | (2010.01) | |
| *H01L 33/00* | (2010.01) | |
| *H01L 33/30* | (2010.01) | |
| *H01L 27/15* | (2006.01) | |

(52) U.S. Cl.
CPC .... *H01L 33/32* (2013.01); *H01L 2224/16146* (2013.01); *H01L 2224/29188* (2013.01); *H01L 2224/32146* (2013.01); *H01L 2224/83896* (2013.01); *H01L 2924/12041* (2013.01); *H01L 2924/1426* (2013.01)

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |

(56) References Cited

U.S. PATENT DOCUMENTS

| | | |
|---|---|---|
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |

(56) References Cited

U.S. PATENT DOCUMENTS

| | | |
|---|---|---|
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |

(56) References Cited

U.S. PATENT DOCUMENTS

| | | |
|---|---|---|
| 8,514,623 B2 | 8/2013 | Widjaja et al. |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,619,490 B2 | 12/2013 | Yu |
| 8,643,162 B2 | 2/2014 | Madurawe |
| 8,650,516 B2 | 2/2014 | McIlrath |
| 8,679,861 B2 | 3/2014 | Bose |
| 8,773,562 B1 | 7/2014 | Fan |
| 8,775,998 B2 | 7/2014 | Morimoto |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,172,008 B2 | 10/2015 | Hwang |
| 9,227,456 B2 | 1/2016 | Chien |
| 9,230,973 B2 | 1/2016 | Pachamuthu et al. |
| 9,334,582 B2 | 5/2016 | See |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,673,257 B1 | 6/2017 | Takaki |
| 9,997,530 B2 | 6/2018 | Yon et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |

(56) References Cited

U.S. PATENT DOCUMENTS

| | | |
|---|---|---|
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |

(56) References Cited

U.S. PATENT DOCUMENTS

| | | |
|---|---|---|
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0243887 A1 | 8/2015 | Saitoh |
| 2015/0255418 A1 | 9/2015 | Gowda |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |

(56) References Cited

U.S. PATENT DOCUMENTS

| | | |
|---|---|---|
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2018/0090368 A1 | 3/2018 | Eun-Jeong et al. |
| 2018/0108416 A1 | 4/2018 | Harari |
| 2018/0294284 A1 | 10/2018 | Tarakji |

OTHER PUBLICATIONS

Demeester, P. et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., no., pp. 14-15, Jun. 12-14, 2007.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Kim, W., et al., "Multi-layered Vertical Gate NAND Flash overcoming stacking limit for terabit density storage", Symposium on VLSI Technology Digest of Technical Papers, 2009, pp. 188-189.
Dicioccio, L., et. al., "Direct bonding for wafer level 3D integration", ICICDT 2010, pp. 110-113.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-VS Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.

(56) References Cited

OTHER PUBLICATIONS

Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked Nand Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.

(56) References Cited

OTHER PUBLICATIONS

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICS, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., no., pp. 562-567, Jun. 4-8, 2007.

Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Phyisics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Elton®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development , vol. 52, No. 4.5, pp. 449-464, Jul. 2008.
Bez, R., et al., "Introduction to Flash memory," Proceedings IEEE, 91(4), 489-502 (2003).
Auth, C. et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.

(56) References Cited

OTHER PUBLICATIONS

James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to -2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n. Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.

(56) References Cited

OTHER PUBLICATIONS

Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.

(56) References Cited

OTHER PUBLICATIONS

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

(56) References Cited

OTHER PUBLICATIONS

Faynot, O. et al., "Planar Fully depleted SOI technology: A Powerful architecture for the 20nm node and beyond," Electron Devices Meeting (IEDM), 2010 IEEE International, vol., no., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

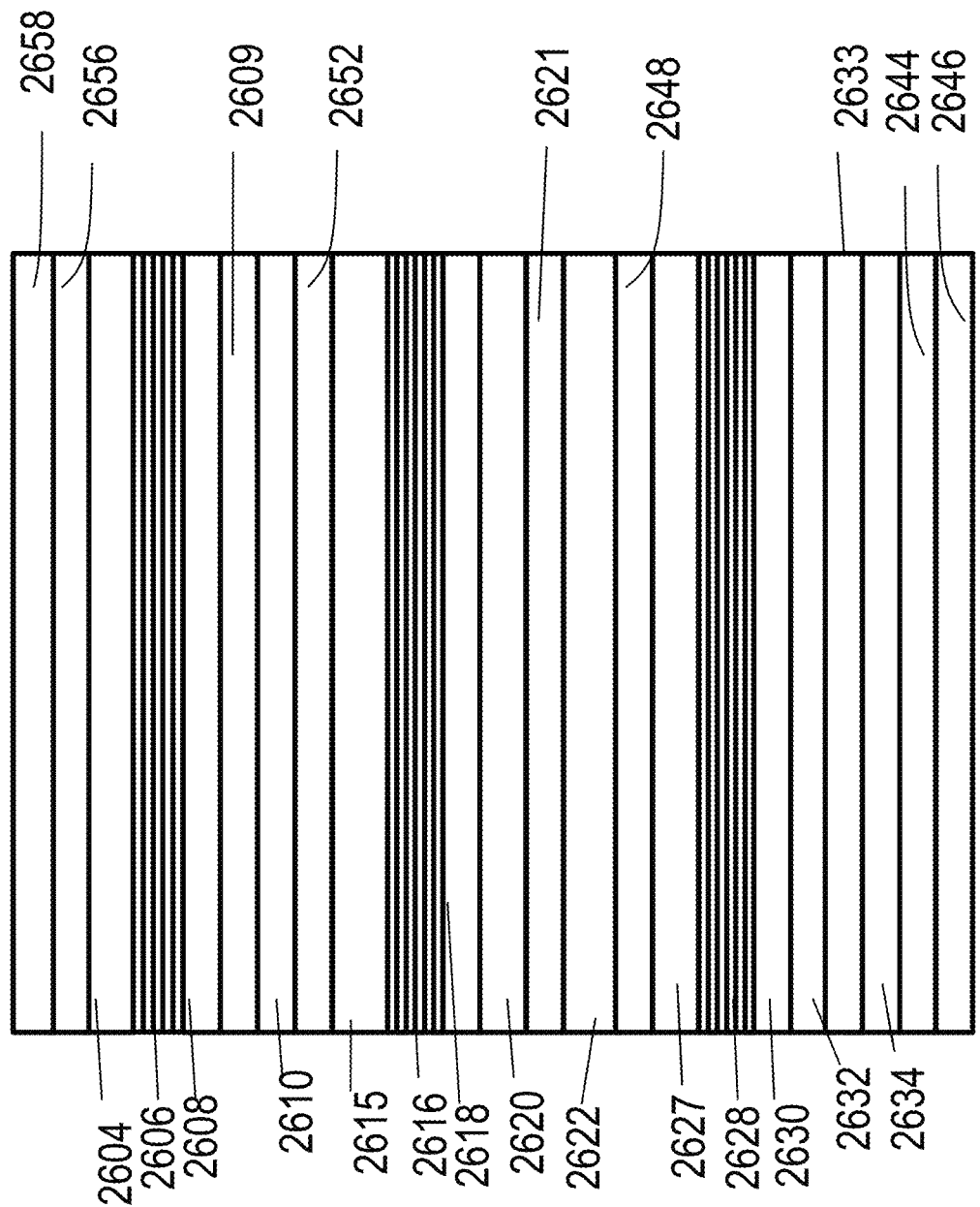

3D MICRODISPLAY DEVICE AND STRUCTURE

CROSS-REFERENCE OF RELATED APPLICATION

This application is a continuation in part of U.S. patent application Ser. No. 14/936,657 filed on Nov. 9, 2015, which is a continuation in part of U.S. patent application Ser. No. 13/274,161 filed on Oct. 14, 2011, now U.S. Pat. No. 9,197,804 issued on Nov. 24, 2015; and this application is a continuation in part of U.S. patent application Ser. No. 12/904,103 filed on Oct. 13, 2011, now U.S. Pat. No. 8,163,581 issued on Apr. 24, 2012; the entire contents of all of the preceding are incorporated herein by reference.

BACKGROUND OF THE INVENTION

(A) Field of the Invention

This invention describes applications of monolithic 3D integration to various disciplines, including but not limited to, for example, light-emitting diodes, displays, image-sensors and solar cells.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology", JSAP International, Number 4, July 2001 by T. Yonehara and K. Sakaguchi ("Yonehara").

Lift-off with a temporary substrate, also referred to as epitaxial lift-off. This is described in "Epitaxial lift-off and its applications", 1993 Semicond. Sci. Technol. 8 1124 by P. Demeester, et al ("Demeester").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced", 19 May 2010, Nature News.

With novel applications of these methods and recognition of their individual strengths and weaknesses, one can significantly enhance today's light-emitting diode (LED), display, image-sensor and solar cell technologies.

Background on LEDs

Light emitting diodes (LEDs) are used in many applications, including automotive lighting, incandescent bulb replacements, and as backlights for displays. Red LEDs are typically made on Gallium Arsenide (GaAs) substrates, and include quantum wells constructed of various materials such as AlInGaP and GaInP. Blue and green LEDs are typically made on Sapphire or Silicon Carbide (SiC) or bulk Gallium Nitride (GaN) substrates, and include quantum wells constructed of various materials such as GaN and InGaN.

A white LED for lighting and display applications can be constructed by either using a blue LED coated with phosphor (called phosphor-coated LED or pcLED) or by combining light from red, blue, and green LEDs (called RGB LED). RGB LEDs are typically constructed by placing red, blue, and green LEDs side-by-side. While RGB LEDs are more energy-efficient than pcLEDs, they are less efficient in mixing red, blue and green colors to form white light. They also are much more costly than pcLEDs. To tackle issues with RGB LEDs, several proposals have been made.

One RGB LED proposal from Hong Kong University is described in "Design of vertically stacked polychromatic light emitting diodes", Optics Express, June 2009 by K. Hui, X. Wang, et al ("Hui"). It involves stacking red, blue, and green LEDs on top of each other after individually packaging each of these LEDs. While this solves light mixing problems, this RGB-LED is still much more costly than a pcLED solution since three LEDs for red, blue, and green color need to be packaged. A pcLED, on the other hand, requires just one LED to be packaged and coated with phosphor.

Another RGB LED proposal from Nichia Corporation is described in "Phosphor Free High-Luminous-Efficiency White Light-Emitting Diodes Composed of InGaN Multi-Quantum Well", Japanese Journal of Applied Physics, 2002 by M. Yamada, Y. Narukawa, et al. ("Yamada"). It involves constructing and stacking red, blue and green LEDs of GaN-based materials on a sapphire or SiC substrate. However, red LEDs are not efficient when constructed with GaN-based material systems, and that hampers usefulness of this implementation. It is not possible to deposit defect-free AlInGaP/InGaP for red LEDs on the same substrate as GaN based blue and green LEDs, due to a mismatch in thermal expansion co-efficient between the various material systems.

Yet another RGB-LED proposal is described in "Cascade Single chip phosphor-free while light emitting diodes", Applied Physics Letters, 2008 by X. Guo, G. Shen, et al. ("Guo"). It involves bonding GaAs based red LEDs with GaN based blue-green LEDs to produce white light. Unfortunately, this bonding process requires 600° C. temperatures, causing issues with mismatch of thermal expansion co-efficients and cracking. Another publication on this topic is "A trichromatic phosphor-free white light-emitting diode by using adhesive bonding scheme", Proc. SPIE, Vol. 7635, 2009 by D. Chuai, X. Guo, et al. ("Chuai"). It involves bonding red LEDs with green-blue LED stacks. Bonding is done at the die level after dicing, which is more costly than a wafer-based approach.

U.S. patent application Ser. No. 12/130,824 describes various stacked RGB LED devices. It also briefly mentions a method for construction of a stacked LED where all layers of the stacked LED are transferred using lift-off with a temporary carrier and Indium Tin Oxide (ITO) to semiconductor bonding. This method has several issues for constructing a RGB LED stack. First, it is difficult to manufacture a lift-off with a temporary carrier of red LEDs for producing a RGB LED stack, especially for substrates larger than 2 inch. This is because red LEDs are typically constructed on non-transparent GaAs substrates, and lift-off with a temporary carrier is done by using an epitaxial lift-off process. Here, the thin film to be transferred typically sits atop a "release-layer" (eg. AlAs), this release layer is removed by etch procedures after the thin film is attached to a temporary substrate. Scaling this process to 4 inch wafers and bigger is difficult. Second, it is very difficult to perform the bonding of ITO to semiconductor materials of a LED layer at reasonable temperatures, as described in the patent application Ser. No. 12/130,824.

It is therefore clear that a better method for constructing RGB LEDs will be helpful. Since RGB LEDs are significantly more efficient than pcLEDs, they can be used as replacements of today's phosphor-based LEDs for many applications, provided a cheap and effective method of constructing RGB LEDs can be invented.

Background on Image-Sensors

Image sensors are used in applications such as cameras. Red, blue, and green components of the incident light are sensed and stored in digital format. CMOS image sensors typically contain a photodetector and sensing circuitry. Almost all image sensors today have both the photodetector and sensing circuitry on the same chip. Since the area consumed by the sensing circuits is high, the photodetector cannot see the entire incident light, and image capture is not as efficient.

To tackle this problem, several researchers have proposed building the photodetectors and the sensing circuitry on separate chips and stacking them on top of each other. A publication that describes this method is "Megapixel CMOS image sensor fabricated in three-dimensional integrated circuit technology", Intl. Solid State Circuits Conference 2005 by Suntharalingam, V., Berger, R., et al. ("Suntharalingam"). These proposals use through-silicon via (TSV) technology where alignment is done in conjunction with bonding. However, pixel size is reaching the 1 µm range, and successfully processing TSVs in the 1 µm range or below is very difficult. This is due to alignment issues while bonding. For example, the International Technology Roadmap for Semiconductors (ITRS) suggests that the 2-4 um TSV pitch will be the industry standard until 2012. A 2-4 µm pitch TSV will be too big for a sub-1 µm pixel. Therefore, novel techniques of stacking photodetectors and sensing circuitry are required.

A possible solution to this problem is given in "Setting up 3D Sequential Integration for Back-Illuminated CMOS Image Sensors with Highly Miniaturized Pixels with Low Temperature Fully-depleted SOI Transistors," IEDM, p. 1-4 (2008) by P. Coudrain et al. ("Coudrain"). In the publication, transistors are monolithically integrated on top of photodetectors. Unfortunately, transistor process temperatures reach 600° C. or more. This is not ideal for transistors (that require a higher thermal budget) and photodetectors (that may prefer a lower thermal budget).

Background on Displays

Liquid Crystal Displays (LCDs) can be classified into two types based on manufacturing technology utilized: (1) Large-size displays that are made of amorphous/polycrystalline silicon thin-film-transistors (TFTs), and (2) Microdisplays that utilize single-crystal silicon transistors. Microdisplays are typically used where very high resolution is needed, such as camera/camcorder view-finders, projectors and wearable computers.

Microdisplays are made in semiconductor fabs with 200 mm or 300 mm wafers. They are typically constructed with LCOS (Liquid-Crystal-on-Silicon) Technology and are reflective in nature. An exception to this trend of reflective microdisplays is technology from Kopin Corporation (U.S. Pat. No. 5,317,236, filed December 1991). This company utilizes transmittive displays with a lift-off layer transfer scheme. Transmittive displays may be generally preferred for various applications.

While lift-off layer transfer schemes are viable for transmittive displays, they are frequently not used for semiconductor manufacturing due to yield issues. Therefore, other layer transfer schemes will be helpful. However, it is not easy to utilize other layer transfer schemes for making transistors in microdisplays. For example, application of "smart-cut" layer transfer to attach monocrystalline silicon transistors to glass is described in "Integration of Single Crystal Si TFTs and Circuits on a Large Glass Substrate", IEDM 2009 by Y. Takafuji, Y. Fukushima, K. Tomiyasu, et al. ("Takafuji"). Unfortunately, hydrogen is implanted through the gate oxide of transferred transistors in the process, and this degrades performance. Process temperatures are as high as 600° C. in this paper, and this requires costly glass substrates. Several challenges therefore need to be overcome for efficient layer transfer, and require innovation.

Background on Solar Cells

Solar cells can be constructed of several materials such as, for example, silicon and compound semiconductors. The highest efficiency solar cells are typically multi junction solar cells that are constructed of compound semiconductor materials. These multi junction solar cells are typically constructed on a germanium substrate, and semiconductors with various band-gaps are epitaxially grown atop this substrate to capture different portions of the solar spectrum.

There are a few issues with standard multi junction solar cells. Since multiple junctions are grown epitaxially above a single substrate (such as Germanium) at high temperature, materials used for different junctions are restricted to those that have lattice constants and thermal expansion co-efficients close to those of the substrate. Therefore, the choice of materials used to build junctions for multi junction solar cells is limited. As a result, most multi junction solar cells commercially available today cannot capture the full solar spectrum. Efficiency of the solar cell can be improved if a large band of the solar spectrum is captured. Furthermore, multi junction solar cells today suffer from high cost of the substrate above which multiple junctions are epitaxially grown. Methods to build multi junction solar cells that tackle both these issues will be helpful.

A method of making multi junction solar cells by mechanically bonding two solar cells, one with a Germanium junction and another with a compound semiconductor junction is described in "Towards highly efficient 4-terminal mechanical photovoltaic stacks", III-Vs Review, Volume 19, Issue 7, September-October 2006 by Giovanni Flamand, Jef Poortmans ("Flamand"). In this work, the authors make the compound semiconductor junctions on a Germanium substrate epitaxially. They then etch away the entire Germanium substrate after bonding to the other substrate with the Germanium junction. The process uses two Germanium substrates, and is therefore expensive.

Techniques to create multi junction solar cells with layer transfer have been described in "Wafer bonding and layer transfer processes for 4-junction high efficiency solar cells," *Photovoltaic Specialists Conference, 2002. Conference Record of the Twenty-Ninth IEEE*, vol., no., pp. 1039-1042, 19-24 May 2002 by Zahler, J. M.; Fontcuberta i Morral, A.; Chang-Geun Ahn; Atwater, H. A.; Wanlass, M. W.; Chu, C. and Iles, P. A. An anneal is used for ion-cut purposes, and this anneal is typically done at temperatures higher than 350-400° C. (if high bond strength is desired). When that happens, cracking and defects can be produced due to mismatch of co-efficients of thermal expansion between various layers in the stack. Furthermore, semiconductor layers are bonded together, and the quality of this bond not as good as oxide-to-oxide bonding, especially for lower process temperatures.

Background on CCD Sensors

Image sensors based on Charge-Coupled Device (CCD) technology has been around for several decades. The CCD technology relies on a collect and shift scheme, wherein charges are collected in individual cells according to the luminosity of the light falling on each of them, then the charges are sequentially shifted towards one edge of the sensor where readout circuits read the sequence of charges one at a time.

The advantage of CCD technology is it has better light sensitivity since almost the entire CCD cell area is dedicated to light collecting, and the control and readout circuits are all on one edge not blocking the light. On the other hand, in a CMOS sensor, the photodiodes in each cell have to share space with the control and readout circuits adjacent to them, and so their size and light sensitivity are therefore limited.

The main issue with CCD technology is this sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Background on High Dynamic Range (HDR) Sensors

Ever since the advent of commercial digital photography in the 1990s, achieving High Dynamic Range (HDR) imaging has been a goal for most camera manufacturers in their image sensors. The idea is to use various techniques to compensate for the lower dynamic range of image sensors relative to the human eye. The concept of HDR however, is not new. Combining multiple exposures of a single image to achieve a wide range of luminosity was actually pioneered in the 1850s by Gustave Le Gray to render seascapes showing both the bright sky and the dark sea. This was necessary to produce realistic photographic images as the film used at that time had exptremely low dynamic range compared to the human eye.

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods use software algorithms to extract HDR information from a single exposure, but as they can only process information that is recordable by the sensor, there is a permanent loss of some details.

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,509,313, 9,640,531, 9,691,760, 9,711,407, 9,721,927, 9,871,034; and pending U.S. Patent Application Publications and applications; 2017/0117291, 2017/0133395, 2017/0207214, 2017/0221761, Ser. Nos. 15/173,686, 62/539,054, 62/562,457; and PCT Applications: PCT/US2010/052093, PCT/US2011/042071, PCT/US2016/52726, PCT/US2017/052359. The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031; and U.S. patent application publication 2016/0064439. The entire contents of the foregoing patents, publications, and applications are incorporated herein by reference.

SUMMARY

Techniques to utilize layer transfer schemes such as ion-cut to form novel light emitting diodes (LEDs), CMOS image sensors, displays, microdisplays and solar cells are discussed.

In one aspect, a 3D micro display, the micro display comprising: a first single crystal layer comprising at least one LED driving circuit; and a second single crystal layer comprising a plurality of light emitting diodes (LEDs), wherein said second single crystal layer overlays said first single crystal layer, wherein said second single crystal layer comprises at least ten first LED pixels, and wherein said second single crystal layer and said first single crystal layer are separated by a vertical distance of less than ten microns.

In another aspect, a 3D micro display, the micro display comprising: a first single crystal layer comprising at least one LED driving circuit; a second single crystal layer comprising a plurality of light emitting diodes (LEDs), wherein said second single crystal layer overlays said first single crystal layer, wherein said second single crystal layer comprises at least ten first LED pixels, and; a third single crystal layer, wherein said third single crystal layer overlays said second single crystal layer.

In another aspect, a 3D micro display, the micro display comprising: a first single crystal layer comprising at least one LED driving circuit; a second single crystal layer comprising a first plurality of light emitting diodes (LEDs), wherein said second single crystal layer overlays said first single crystal layer, wherein said second single crystal layer comprises at least ten individual LED pixels; and a second plurality of light emitting diodes (LEDs), wherein said first plurality of light emitting diodes (LEDs) emits a first light with a first wavelength, wherein said second plurality of light emitting diodes (LEDs) emits a second light with a second wavelength, and wherein said first wavelength and said second wavelength differ by greater than 10 nm.

BRIEF DESCRIPTION OF THE DRAWINGS

Various embodiments of the invention will be understood and appreciated more fully from the following detailed description, taken in conjunction with the drawings in which:

FIGS. 5A-5C are exemplary drawn illustrations of a microdisplay constructed using stacked RGB LEDs and control circuits are connected to each pixel with solder bumps.

DETAILED DESCRIPTION

Figure 1A:
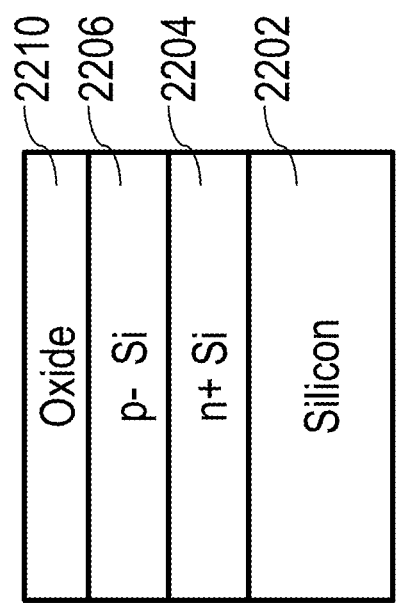
FIGS. 1A-1G are exemplary drawn illustrations of a display constructed using sub-400° C. processed single crystal silicon recessed channel transistors on a glass substrate.

Embodiments of the present invention are now described with reference to FIGS. 1-6, it being appreciated that the figures illustrate the subject matter not to scale or to measure.

A smart layer transfer may be defined as one or more of the following processes:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology," JSAP International, Number 4, July 2001 by T. Yonehara and K. Sakaguchi ("Yonehara").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced," 19 May 2010, Nature News.

This process of constructing RGB LEDs could include several steps that occur in a sequence from Step (A) to Step (S). Many of them share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

NuDisplay Technology

In displays and microdisplays (small size displays where optical magnification is needed), transistors need to be formed on glass or plastic substrates. These substrates typically cannot withstand high process temperatures (e.g., >400° C.). Layer transfer can be advantageously used for constructing displays and microdisplays as well, since it may enable transistors to be processed on these substrates at <400° C. Various embodiments of transistors constructed on glass substrates are described in this patent application. These transistors constructed on glass substrates could form part of liquid crystal displays (LCDs) or other types of displays. It will be clear to those skilled in the art based on the present disclosure that these techniques can also be applied to plastic substrates.

FIGS. 1A-1G describe a process for forming recessed channel single crystal (or monocrystalline) transistors on glass substrates at a temperature approximately less than 400° C. for display and microdisplay applications. This process could include several steps that occur in a sequence from Step (A) to Step (G). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 1A. A silicon wafer 2202 is taken and a n+ region 2204 is formed by ion implantation. Following this formation, a layer of p– Silicon 2206 is epitaxially grown. An oxide layer 2210 is then deposited. Following this deposition, an anneal is performed to activate dopants in various layers. It will be clear to one skilled in the art based on the present disclosure that various other procedures can be used to get the structure shown in FIG. 22A.

Figure 1B:
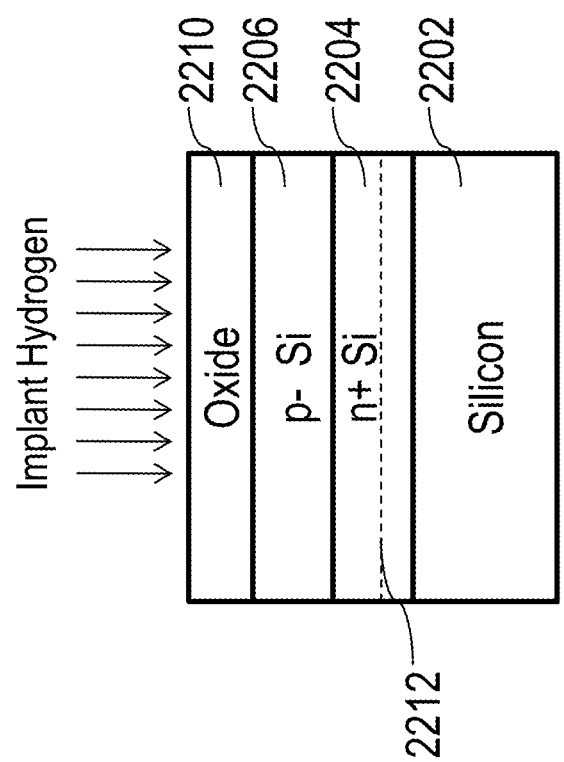

Step (B) is illustrated in FIG. 1B. Hydrogen is implanted into the structure shown in FIG. 22A at a certain depth indicated by 2212. Alternatively, Helium can be used for this purpose. Various elements in FIG. 1B, such as 2202, 2204, 2006, and 2210 have been described previously.

Figure 1C:
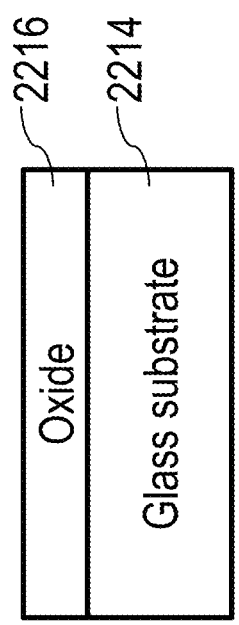

Step (C) is illustrated in FIG. 1C. A glass substrate 2214 is taken and a silicon oxide layer 2216 is deposited atop it at compatible temperatures.

Figure 1D:
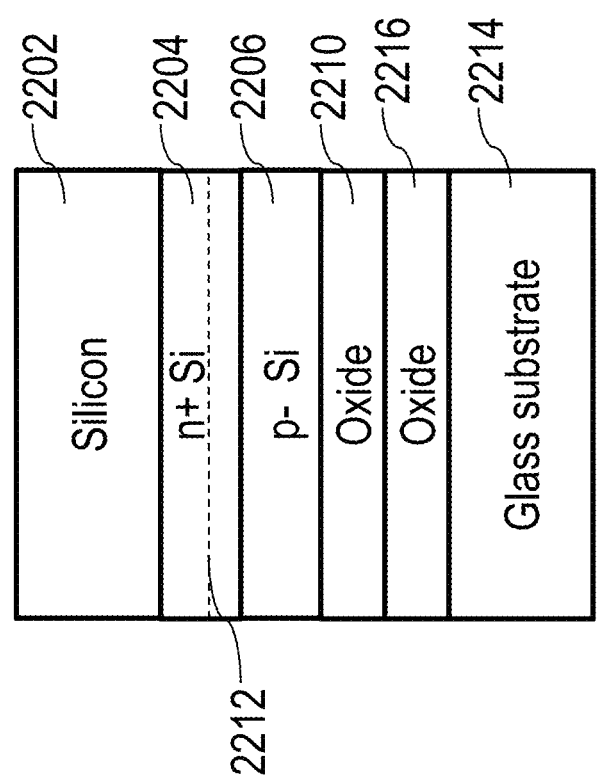

Step (D) is illustrated in FIG. 1D. Various elements in FIG. 1D, such as 2202, 2204, 2206, 2210, 2214, and 2216 have been described previously. The structure shown in FIG. 1B is flipped and bonded to the structure shown in FIG. 1C using oxide-to-oxide bonding of layers 2210 and 2216.

Figure 1E:
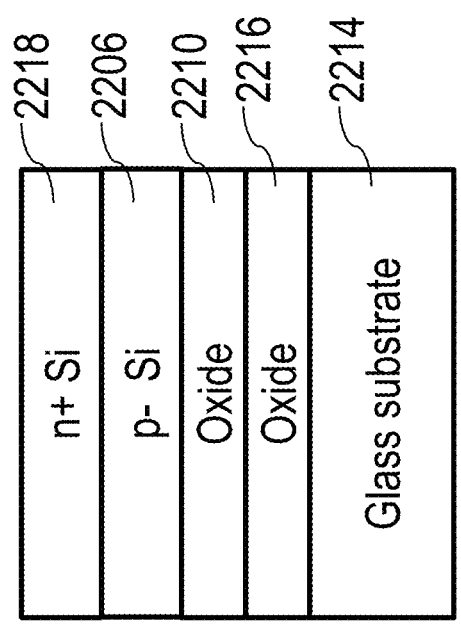

Step (E) is illustrated in FIG. 1E. The structure shown in FIG. 1D is cleaved at the hydrogen plane 2212 of FIG. 1D. A CMP is then done to planarize the surface and yield the n+ Si layer 2218. Various other elements in FIG. 1E, such as 2214, 2216, 2210 and 2206 have been described previously.

Figure 1F:
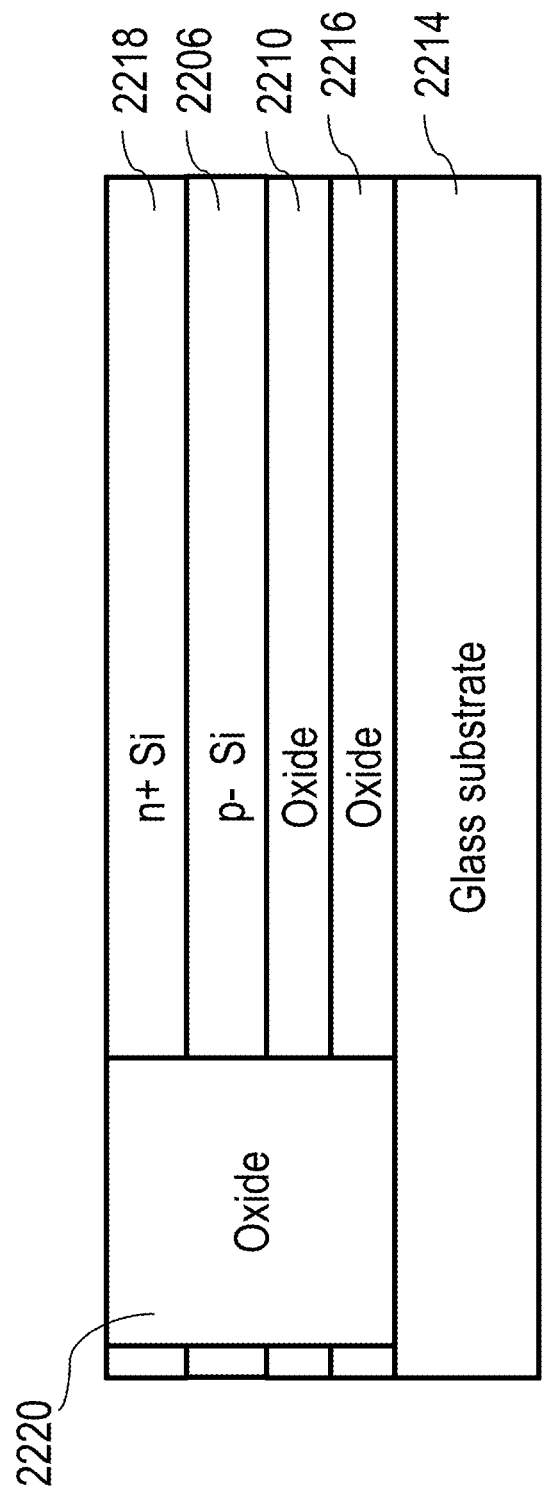

Step (F) is illustrated in FIG. 1F. Various elements in FIG. 1F such as 2214, 2216, 2210, and 2206 have been described previously. An oxide layer 2220 is formed using a shallow trench isolation (STI) process. This helps isolate transistors.

Figure 1G:
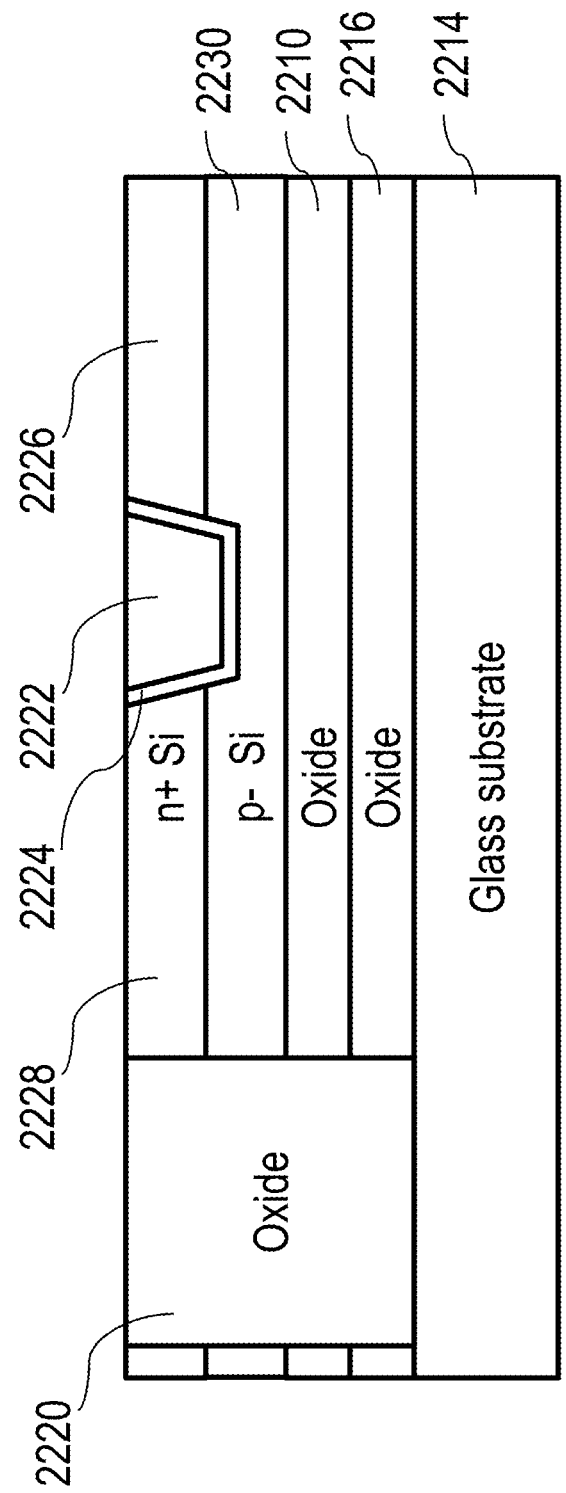

Step (G) is illustrated in FIG. 1G. Various elements in FIG. 1G such as 2210, 2216, 2220 and 2214 have been described previously. Using etch techniques, part of the n+ Silicon layer from FIG. 1F and optionally p– Silicon layer from FIG. 1F are etched. After this a thin gate dielectric is deposited, after which a gate dielectrode is deposited. The gate dielectric and gate electrode are then polished away to form the gate dielectric layer 2224 and gate electrode layer 2222. The n+ Silicon layers 2228 and 2226 form the source and drain regions of the transistors while the p– Silicon region after this step is indicated by 2230. Contacts and other parts of the display/microdisplay are then fabricated. It can be observed that during the whole process, the glass substrate substantially always experiences temperatures less than 400° C., or even lower. This is because the crystalline silicon can be transferred atop the glass substrate at a temperature less than 400° C., and dopants are pre-activated before layer transfer to glass.

FIG. 2A-2I describes a process of forming both nMOS and pMOS transistors with single-crystal silicon on a glass substrate at temperatures less than 400° C., and even lower. Ion-cut technology (which is a smart layer transfer technology) is used. While the process flow described is shown for both nMOS and pMOS on a glass substrate, it could also be used for just constructing nMOS devices or for just constructing pMOS devices. This process could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 2A:
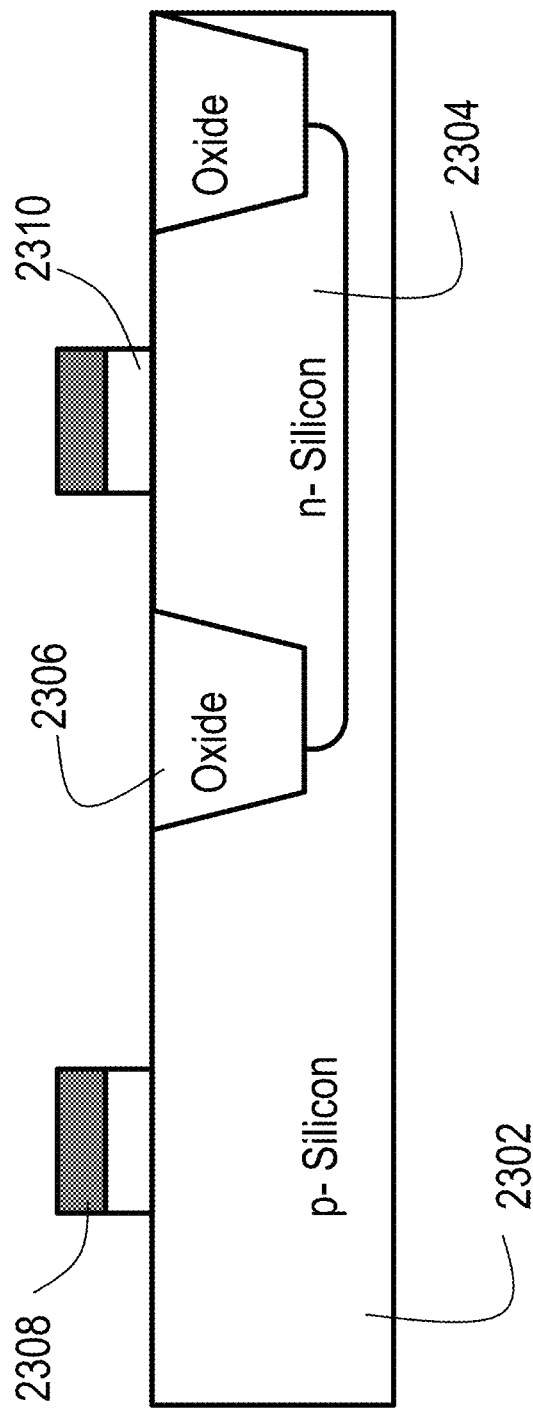
FIGS. 2A-2I are exemplary drawn illustrations of a display constructed using sub-400° C. processed single crystal silicon replacement gate transistors on a glass substrate.

Step (A) is illustrated in FIG. 2A. A p– Silicon wafer 2302 is taken and a n well 2304 is formed on the p– Silicon wafer 2302. Various additional implants to optimize dopant profiles can also be done. Following this formation, an isolation process is conducted to form isolation regions 2306. A dummy gate dielectric 2310 made of silicon dioxide and a dummy gate electrode 2308 made of polysilicon are constructed.

Figure 2B:
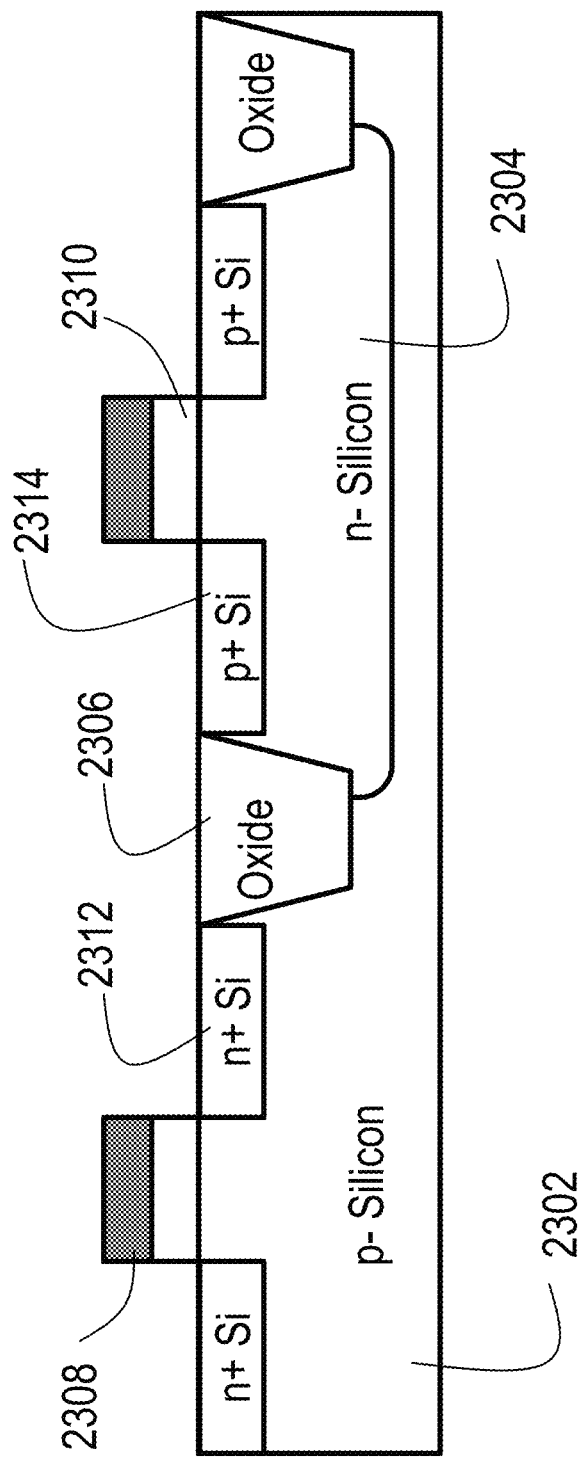

Step (B) is illustrated in FIG. 2B. Various elements of FIG. 2B, such as 2302, 2304, 2306, 2308 and 2310 have been described previously. Implants are done to form source-drain regions 2312 and 2314 for both nMOS and pMOS transistors. A rapid thermal anneal (RTA) is then done to activate dopants. Alternatively, a spike anneal or a laser anneal could be done.

Figure 2C:
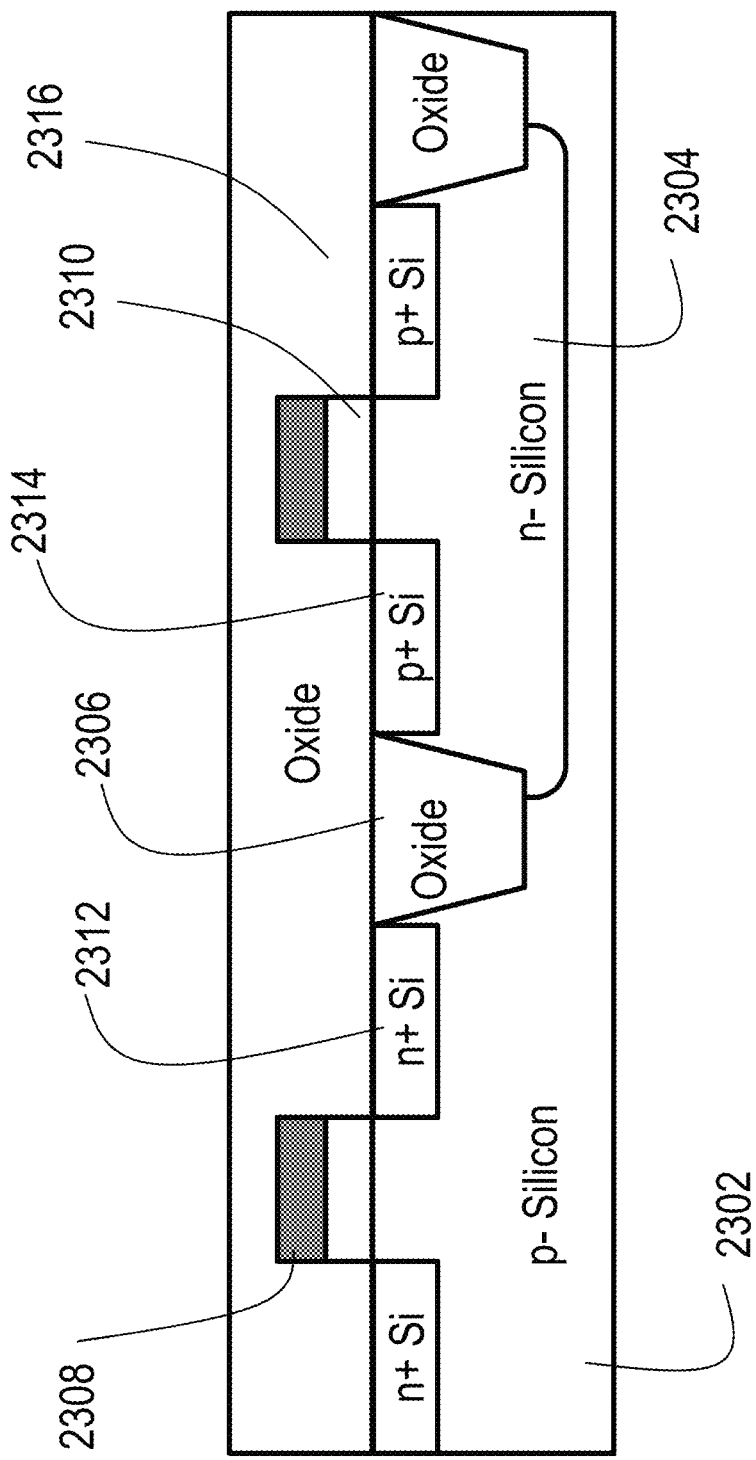

Step (C) is illustrated in FIG. 2C. Various elements of FIG. 2C such as 2302, 2304, 2306, 2308, 2310, 2312 and 2314 have been described previously. An oxide layer 2316 is deposited and planarized with CMP.

Figure 2D:
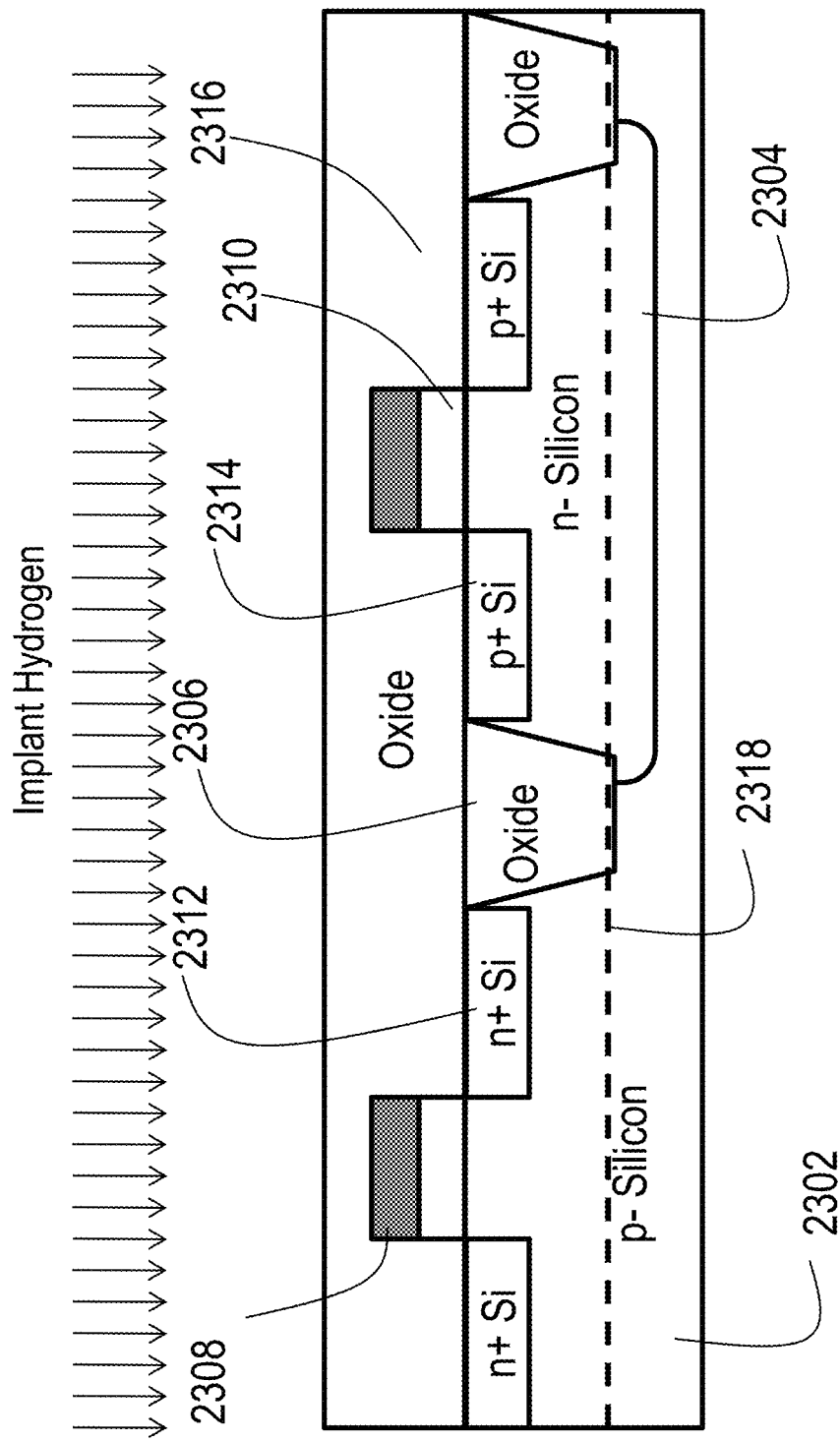

Step (D) is illustrated in FIG. 2D. Various elements of FIG. 2D such as 2302, 2304, 2306, 2308, 2310, 2312, 2314, and 2316 have been described previously. Hydrogen is implanted into the wafer at a certain depth indicated by 2318. Alternatively, helium can be implanted.

Figure 2E:
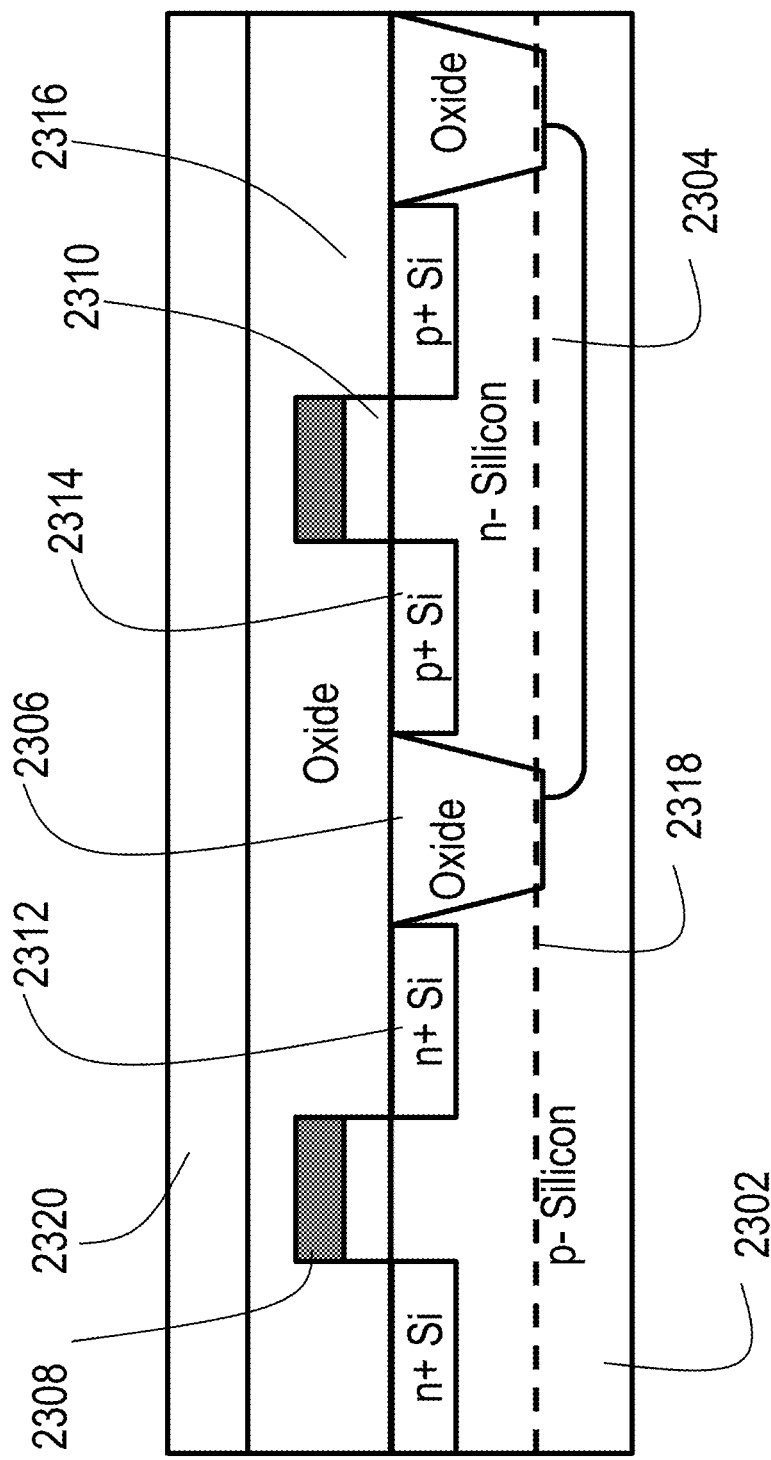

Step (E) is illustrated in FIG. 2E. Various elements of FIG. 2E such as 2302, 2304, 2306, 2308, 2310, 2312, 2314, 2316, and 2318 have been described previously. Using a temporary bonding adhesive, the oxide layer is bonded to a temporary carrier wafer 2320. An example of a temporary bonding adhesive is a polyimide that can be removed by shining a laser. An example of a temporary carrier wafer is glass.

Figure 2F:
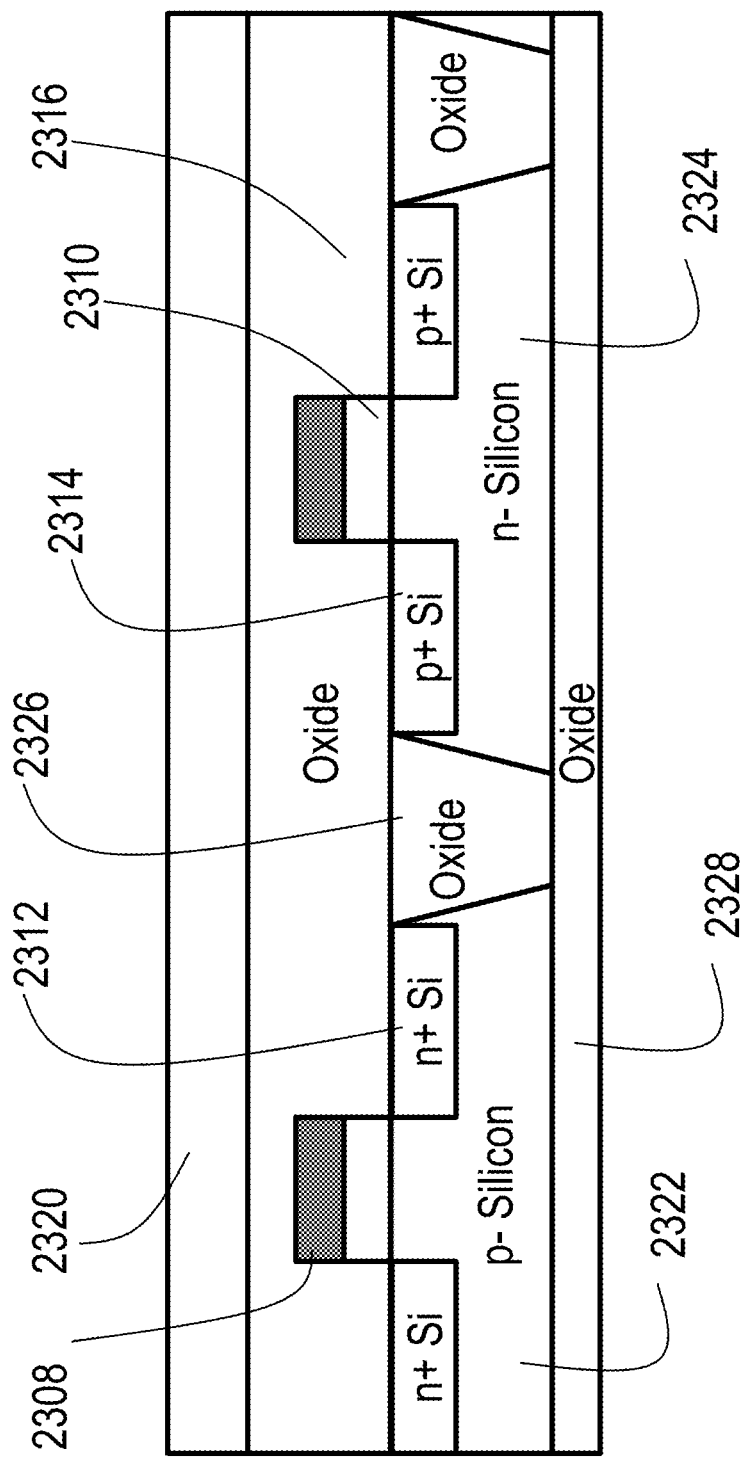

Step (F) is illustrated in FIG. 2F. The structure shown in FIG. 2E is cleaved at the hydrogen plane using a mechanical force. Alternatively, an anneal could be used. Following this cleave, a CMP is done to planarize the surface. An oxide layer is then deposited. FIG. 2F shows the structure after all these steps are done, with the deposited oxide layer indicated as 2328. After the cleave, the p– Silicon region is indicated as 2322, the n– Silicon region is indicated as 2324, and the oxide isolation regions are indicated as 2326. Various other elements in FIG. 23F such as 2308, 2320, 2312, 2314, 2310, and 2316 have been described previously.

Figure 2G:
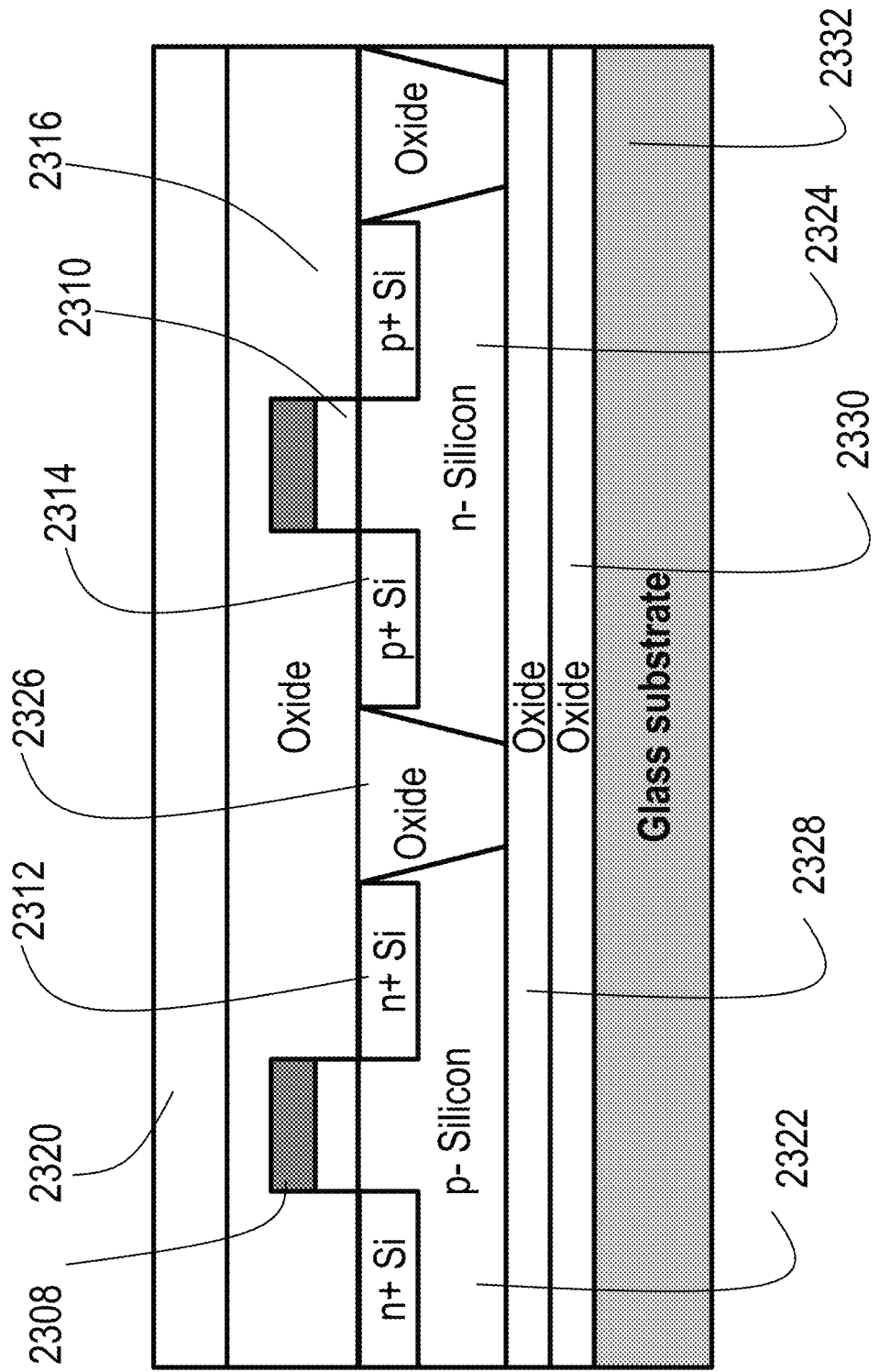
Figure 2H:
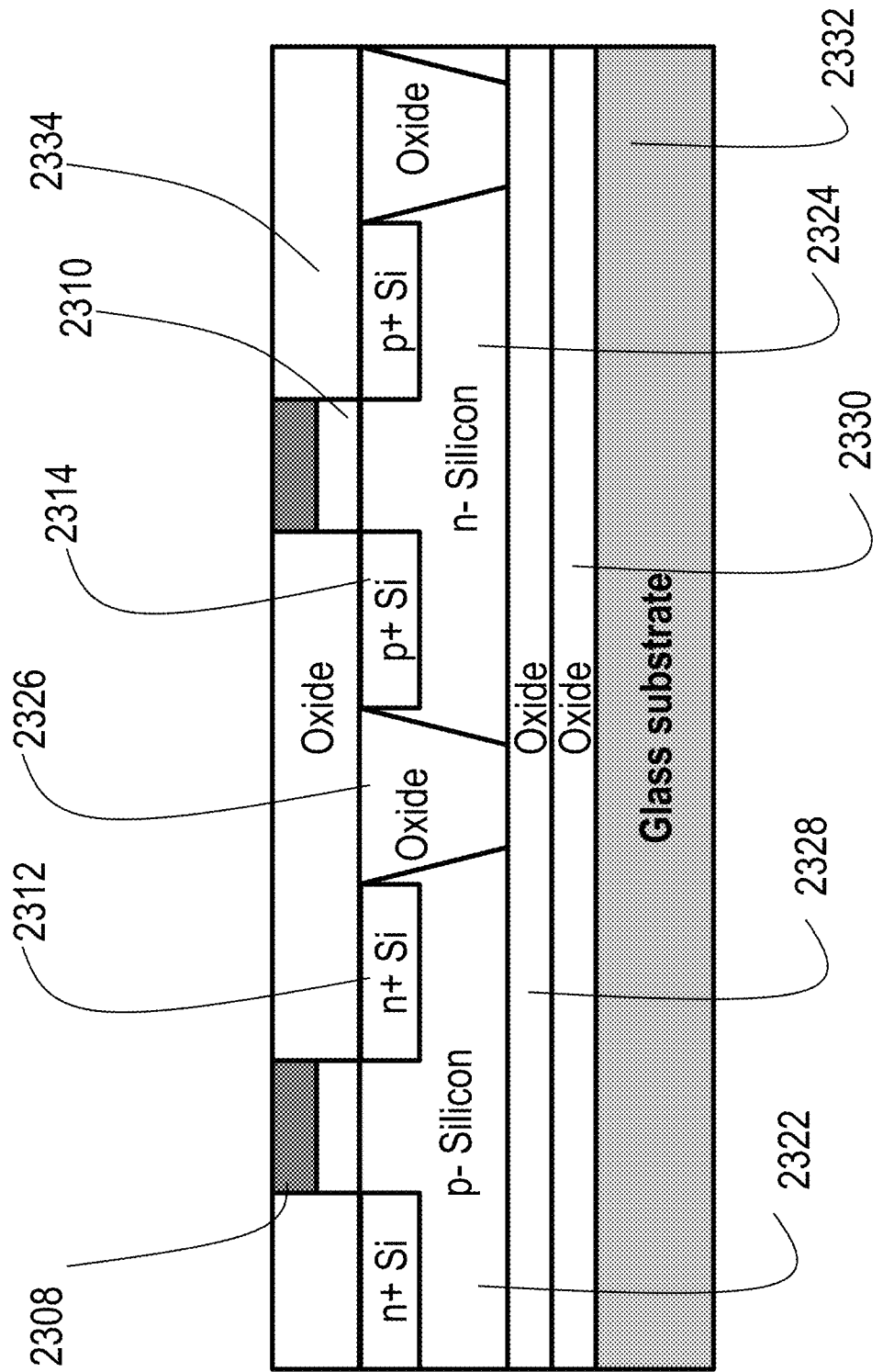

Step (G) is illustrated in FIG. 2G. The structure shown in FIG. 2F is bonded to a glass substrate 2332 with an oxide layer 2330 using oxide-to-oxide bonding. Various elements in FIG. 2G such as 2308, 2326, 2322, 2324, 2312, 2314, and 2310 have been described previously. Oxide regions 2328 and 2330 are bonded together. The temporary carrier wafer from FIG. 2F is removed by shining a laser through it. A CMP process is then conducted to reach the surface of the gate electrode 2308. Thus, the structure may be illustrated by FIG. 2H. The oxide layer remaining is denoted as 2334.

Figure 2I:
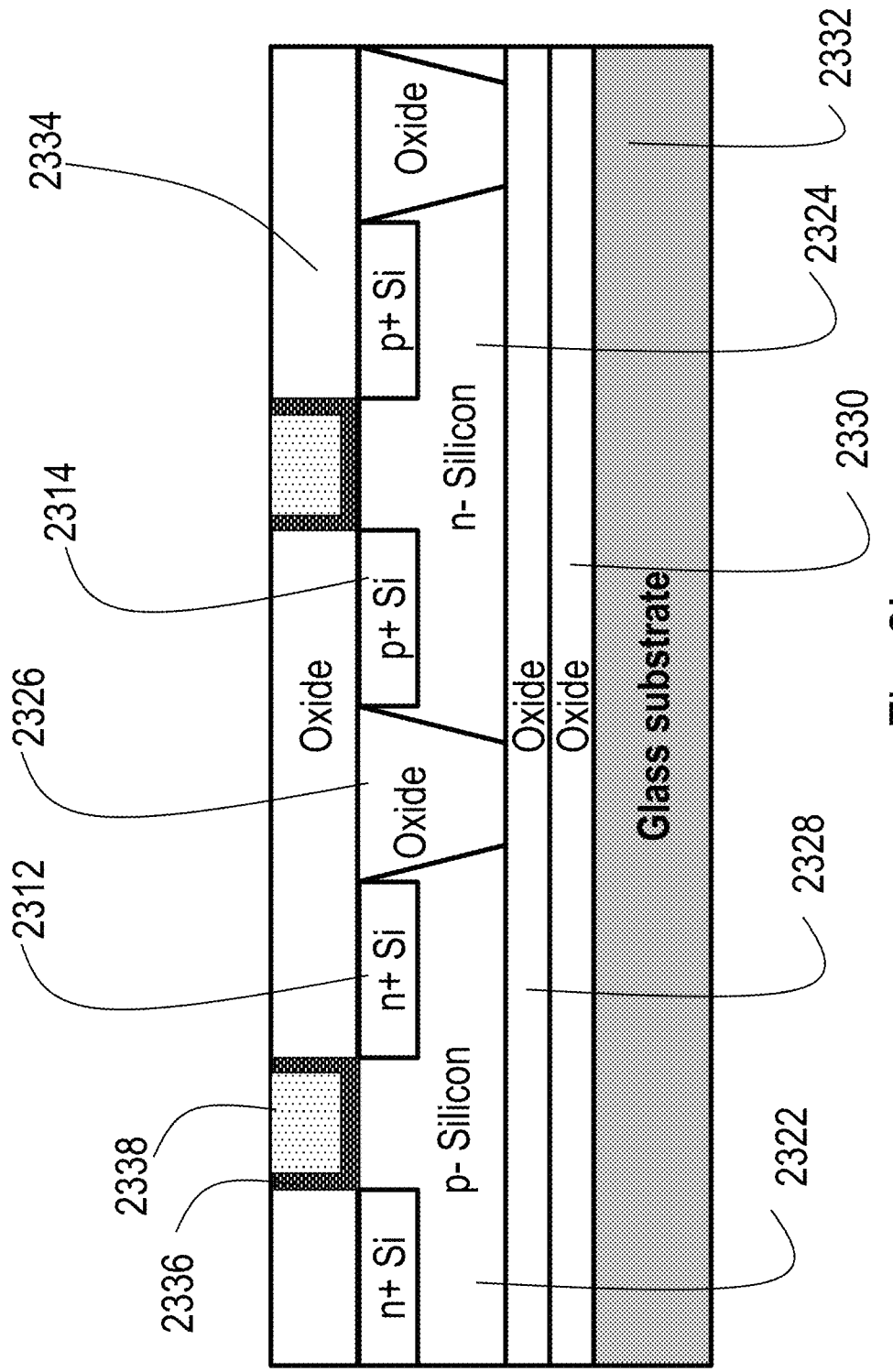

Step (H) is illustrated in FIG. 2I. Various elements in FIG. 2I such as 2312, 2314, 2328, 2330, 2332, 2334, 2326, 2324, and 2322 have been described previously. The dummy gate dielectric and dummy gate electrode are etched away in this step and a replacement gate dielectric 2336 and a replacement gate electrode 2338 are deposited and planarized with CMP. Examples of replacement gate dielectrics could be hafnium oxide or aluminum oxide while examples of replacement gate electrodes could be TiN or TaN or some other material. Contact formation, metallization and other steps for building a display/microdisplay are then conducted. It can be observed that after attachment to the glass substrate, no process step requires a processing temperature above 400° C.

FIGS. 3A-3F describe an embodiment of this invention, where single-crystal Silicon junction-less transistors are constructed above glass substrates at a temperature approximately less than 400° C. An ion-cut process (which is a smart layer transfer process) is utilized for this purpose. This process could include several steps that occur in a sequence from Step (A) to Step (F). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 3A:
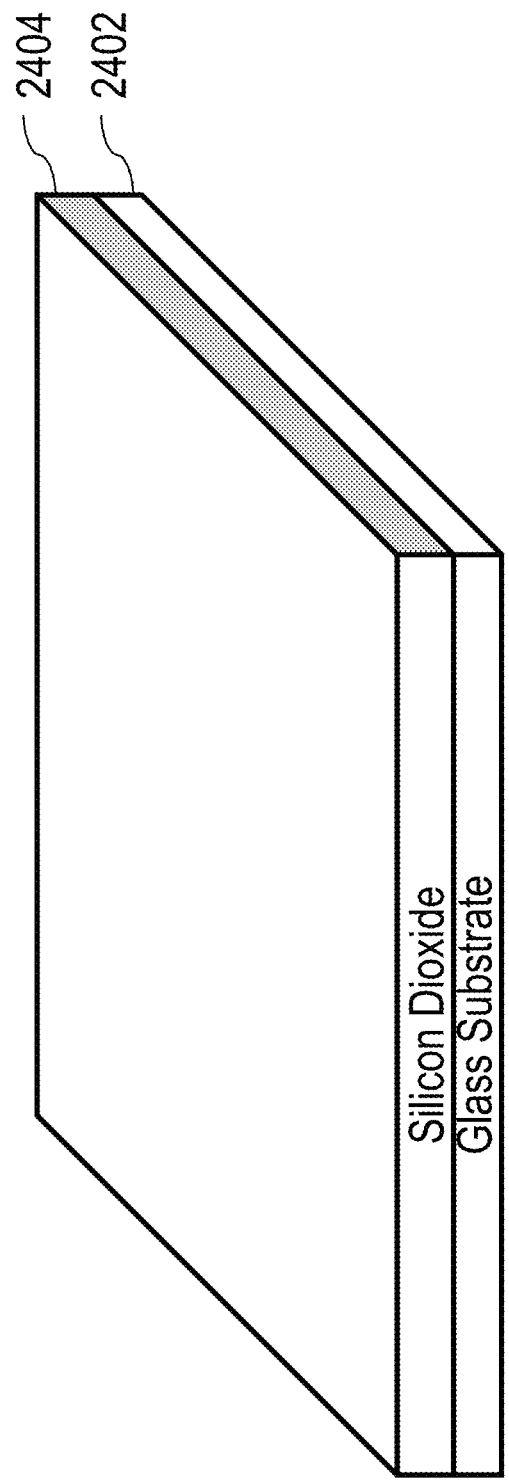
FIGS. 3A-3F are exemplary drawn illustrations of a display constructed using sub-400° C. processed single crystal junction-less transistors on a glass substrate.

Step (A) is illustrated in FIG. 3A. A glass substrate 2402 is taken and a layer of silicon oxide 2404 is deposited on the glass substrate 2402.

Figure 3B:
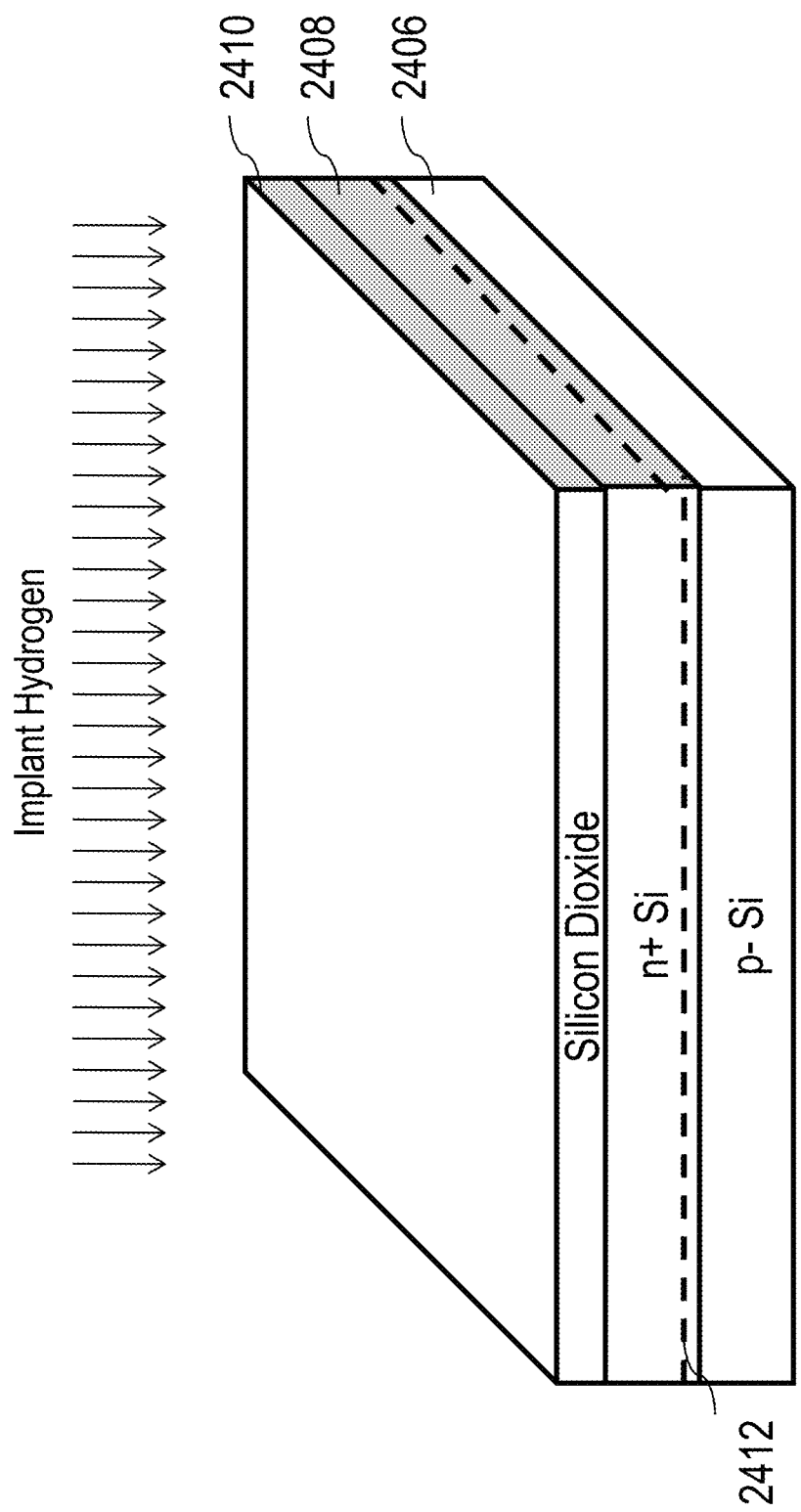

Step (B) is illustrated in FIG. 3B. A p− Silicon wafer 2406 is implanted with a n+ Silicon layer 2408 above which an oxide layer 2410 is deposited. A RTA or spike anneal or laser anneal is conducted to activate dopants. Following this, hydrogen is implanted into the wafer at a certain depth indicated by 2412. Alternatively, helium can be implanted.

Figure 3C:
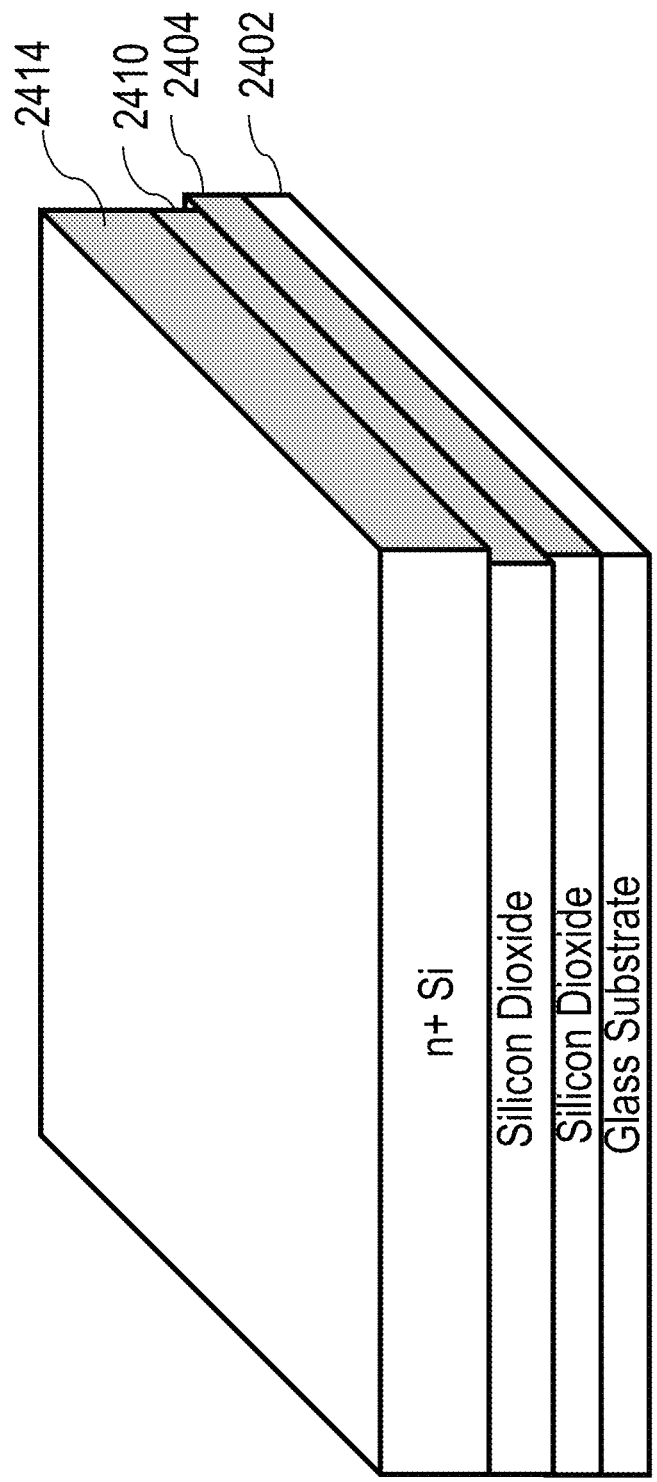

Step (C) is illustrated in FIG. 3C. The structure shown in FIG. 3B is flipped and bonded onto the structure shown in FIG. 3A using oxide-to-oxide bonding. This bonded structure is cleaved at its hydrogen plane, after which a CMP is done. FIG. 3C shows the structure after all these processes are completed. 2414 indicates the n+ Si layer, while 2402, 2404, and 2410 have been described previously.

Figure 3D:
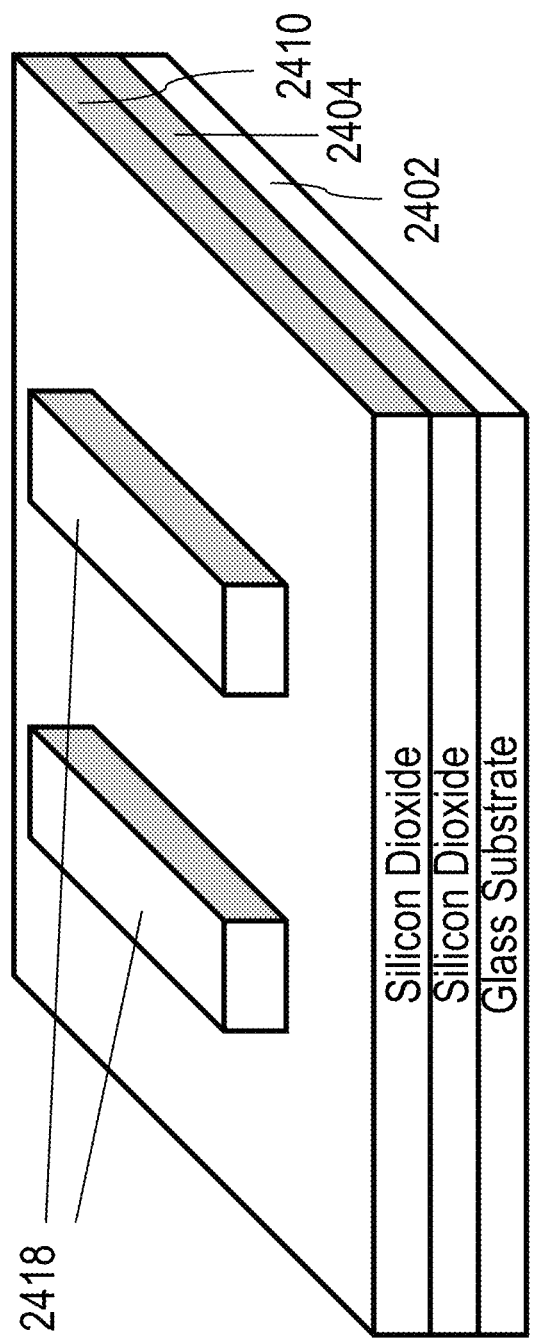

Step (D) is illustrated in FIG. 3D. A lithography and etch process is conducted to pattern the n+ Silicon layer 2414 in FIG. 3C to form n+ Silicon regions 2418 in FIG. 3D. The glass substrate is indicated as 2402 and the bonded oxide layers 2404 and 2410 are shown as well.

Figure 3E:
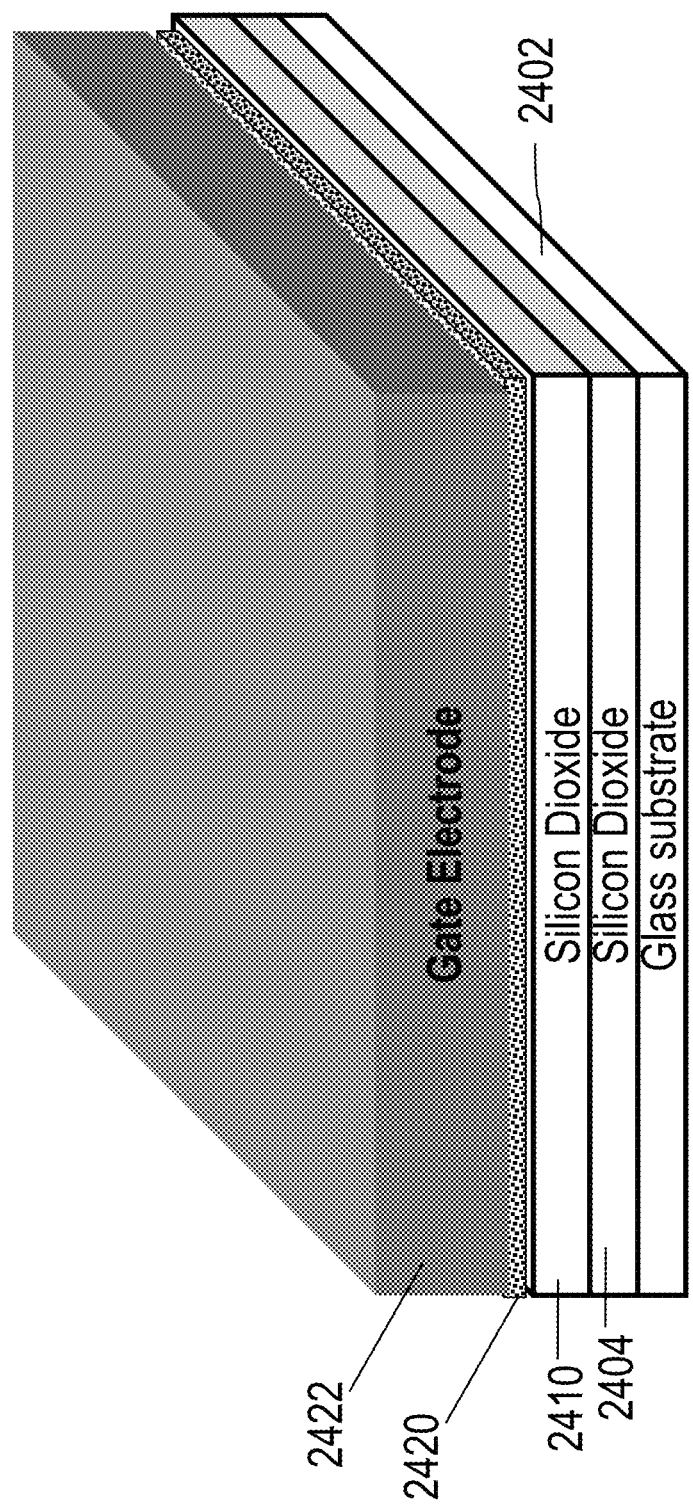

Step (E) is illustrated in FIG. 3E. A gate dielectric 2420 and gate electrode 2422 are deposited, following which a CMP is done. 2402 is as described previously. The n+ Si regions 2418 are not visible in this figure, since they are covered by the gate electrode 2422. Oxide regions 2404 and 2410 have been described previously.

Figure 3F:
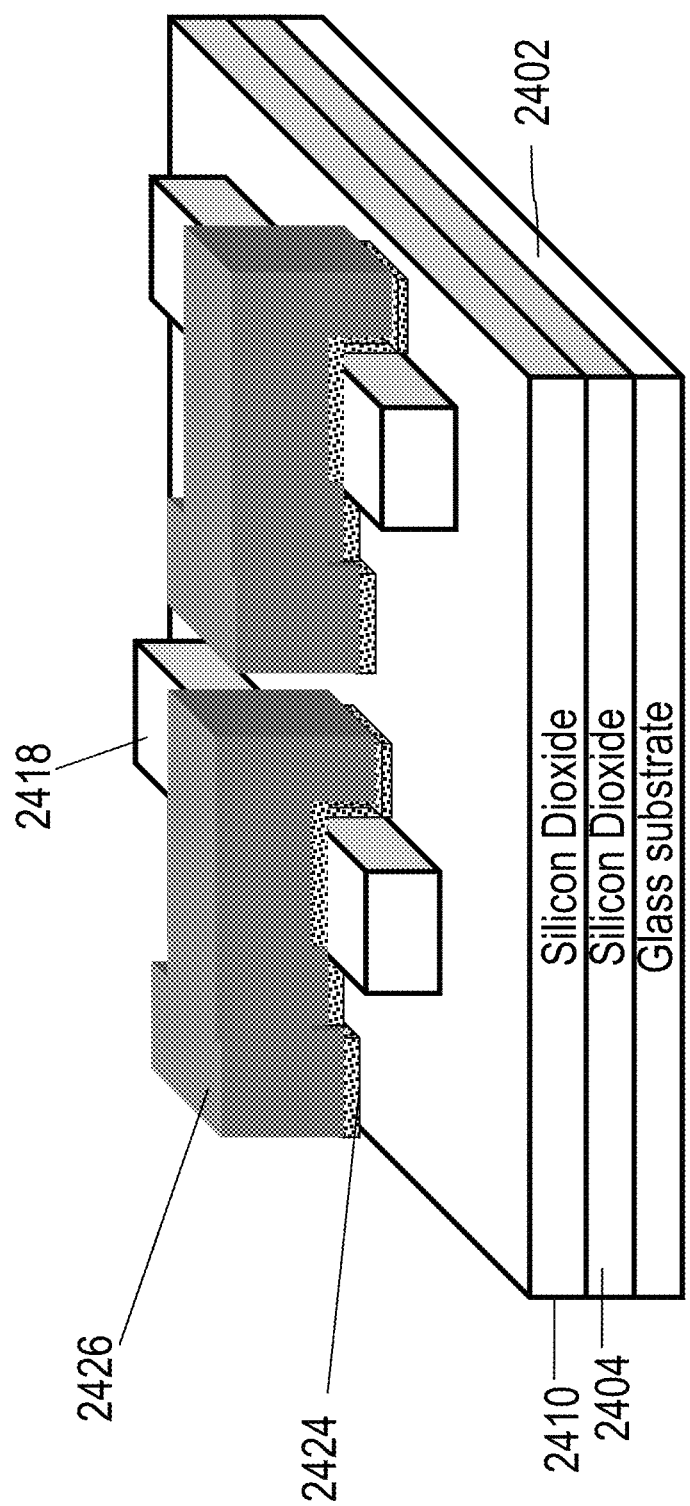

Step (F) is illustrated in FIG. 3F. The gate dielectric 2420 and gate electrode 2422 from FIG. 3E are patterned and etched to form the structure shown in FIG. 3F. The gate dielectric after the etch process is indicated as 2424 while the gate electrode after the etch process is indicated as 2426. n+Si regions are indicated as 2418 while the glass substrate is indicated as 2402. Oxide regions 2404 and 2410 have been described previously. It can be observed that a three-side gated junction-less transistor is formed at the end of the process described with respect of FIGS. 3A-3F. Contacts, metallization and other steps for constructing a display/microdisplay are performed after the steps indicated by FIGS. 3A-3F. It can be seen that the glass substrate is not exposed to temperatures greater than approximately 400° C. during any step of the above process for forming the junction-less transistor.

FIGS. 4A-D describe an embodiment of this invention, where amorphous Si or polysilicon junction-less transistors are constructed above glass substrates at a temperature less than 400° C. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 4A:
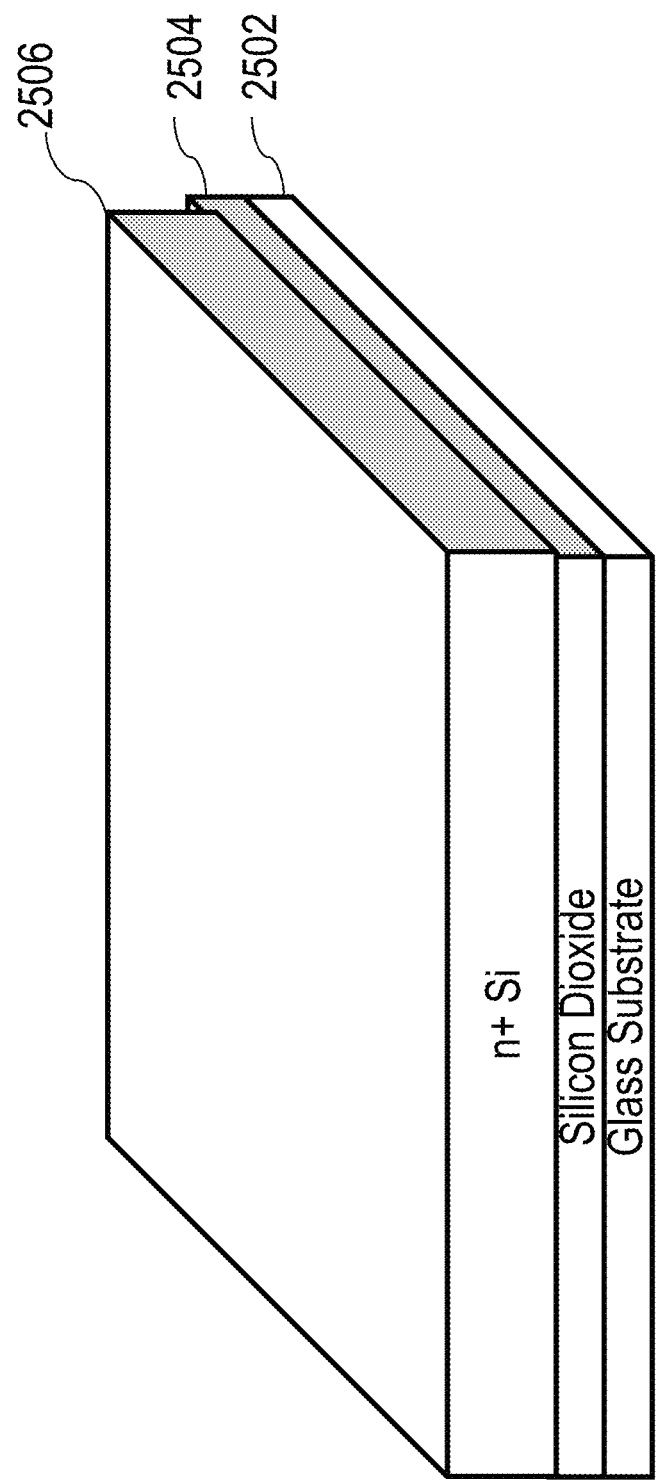
FIGS. 4A-4D are exemplary drawn illustrations of a display constructed using sub-400° C. processed amorphous silicon or polysilicon junctionless transistors on a glass substrate.

Step (A) is illustrated in FIG. 4A. A glass substrate 2502 is taken and a layer of silicon oxide 2504 is deposited on the glass substrate 2502. Following this deposition, a layer of n+ Si 2506 is deposited using low-pressure chemical vapor deposition (LPCVD) or plasma enhanced chemical vapor deposition (PECVD). This layer of n+ Si could optionally be hydrogenated.

Figure 4B:
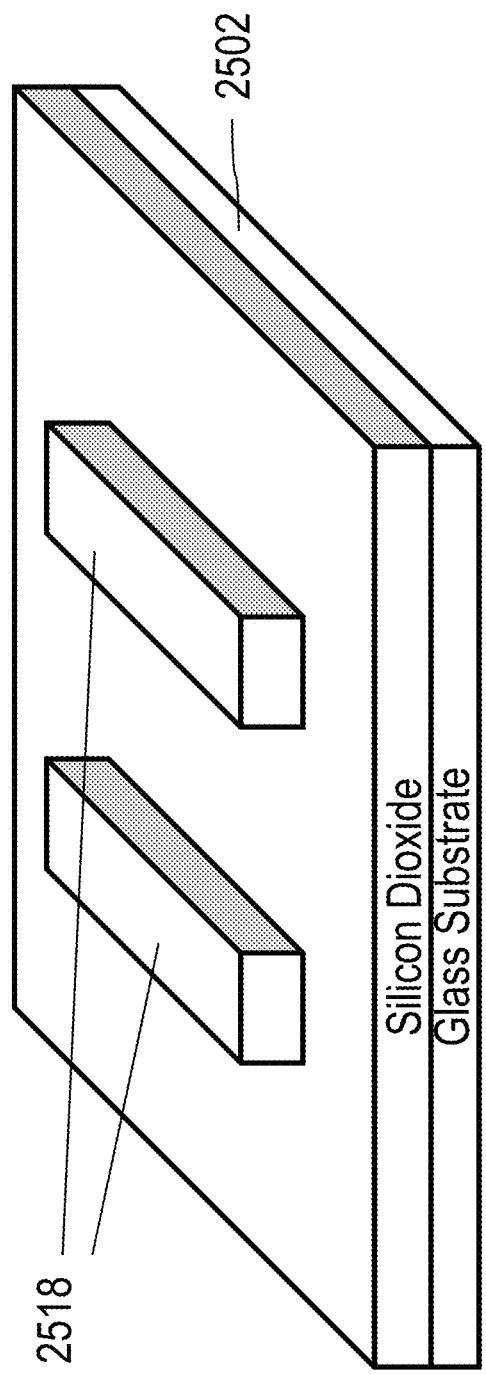

Step (B) is illustrated in FIG. 4B. A lithography and etch process is conducted to pattern the n+ Silicon layer 2506 in FIG. 4A to form n+ Silicon regions 2518 in FIG. 4B. 2502 and 2504 have been described previously.

Figure 4C:
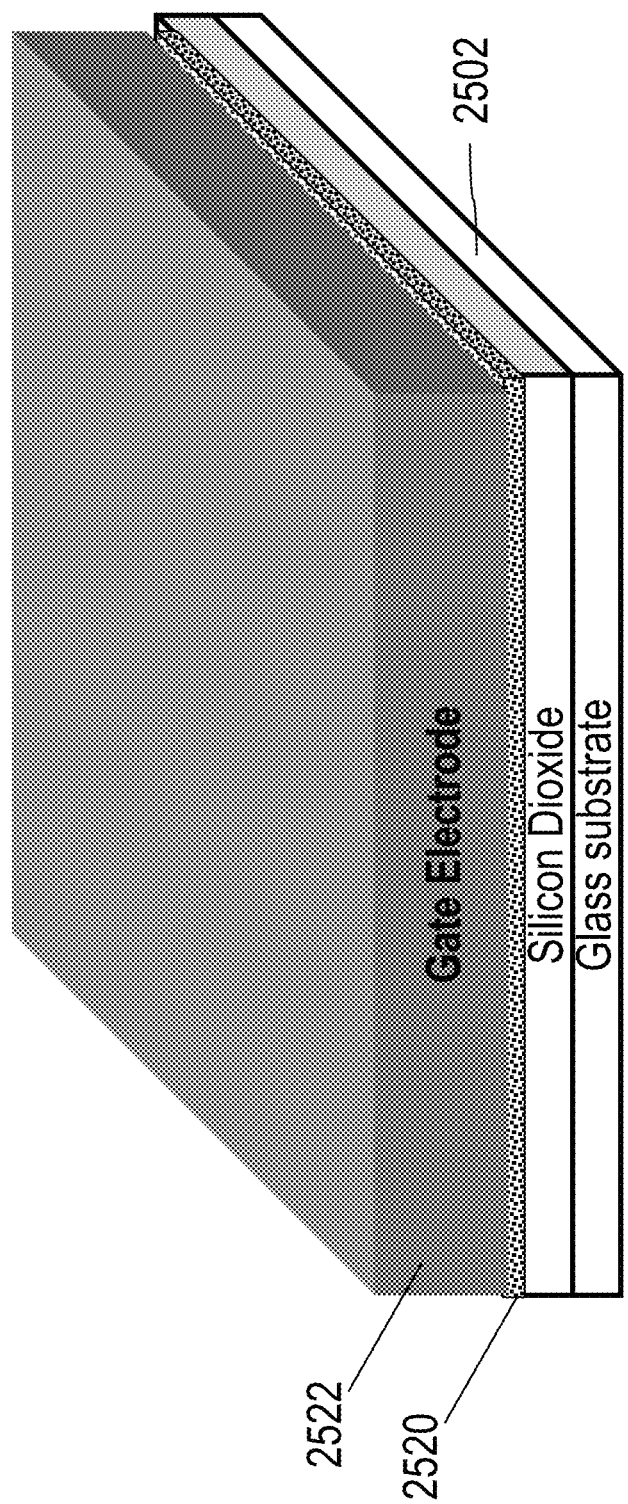

Step (C) is illustrated in FIG. 4C. A gate dielectric 2520 and gate electrode 2522 are deposited, following which a CMP is optionally done. 2502 is as described previously. The n+ Si regions 2518 are not visible in this figure, since they are covered by the gate electrode 2522.

Figure 4D:
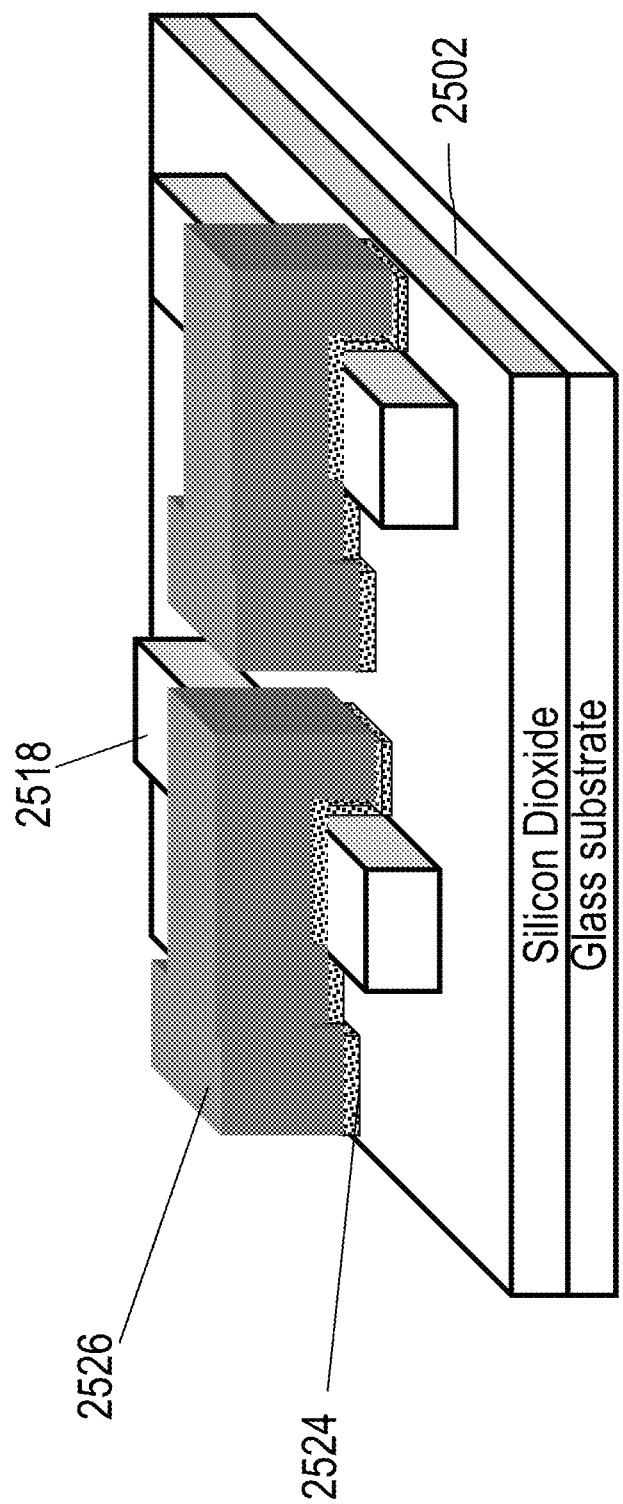

Step (D) is illustrated in FIG. 4D. The gate dielectric 2520 and gate electrode 2522 from FIG. 4C are patterned and etched to form the structure shown in FIG. 4D. The gate dielectric after the etch process is indicated as 2524 while the gate electrode after the etch process is indicated as 2526. n+ Si regions are indicated as 2518 while the glass substrate is indicated as 2502. It can be observed that a three-side gated junction-less transistor is formed at the end of the process described with respect of FIGS. 4A-4D. Contacts, metallization and other steps for constructing a display/microdisplay are performed after the steps indicated by FIGS. 4A-4D. It can be seen that the glass substrate is not exposed to temperatures greater than 400° C. during any step of the above process for forming the junction-less transistor.

Figure 5B:
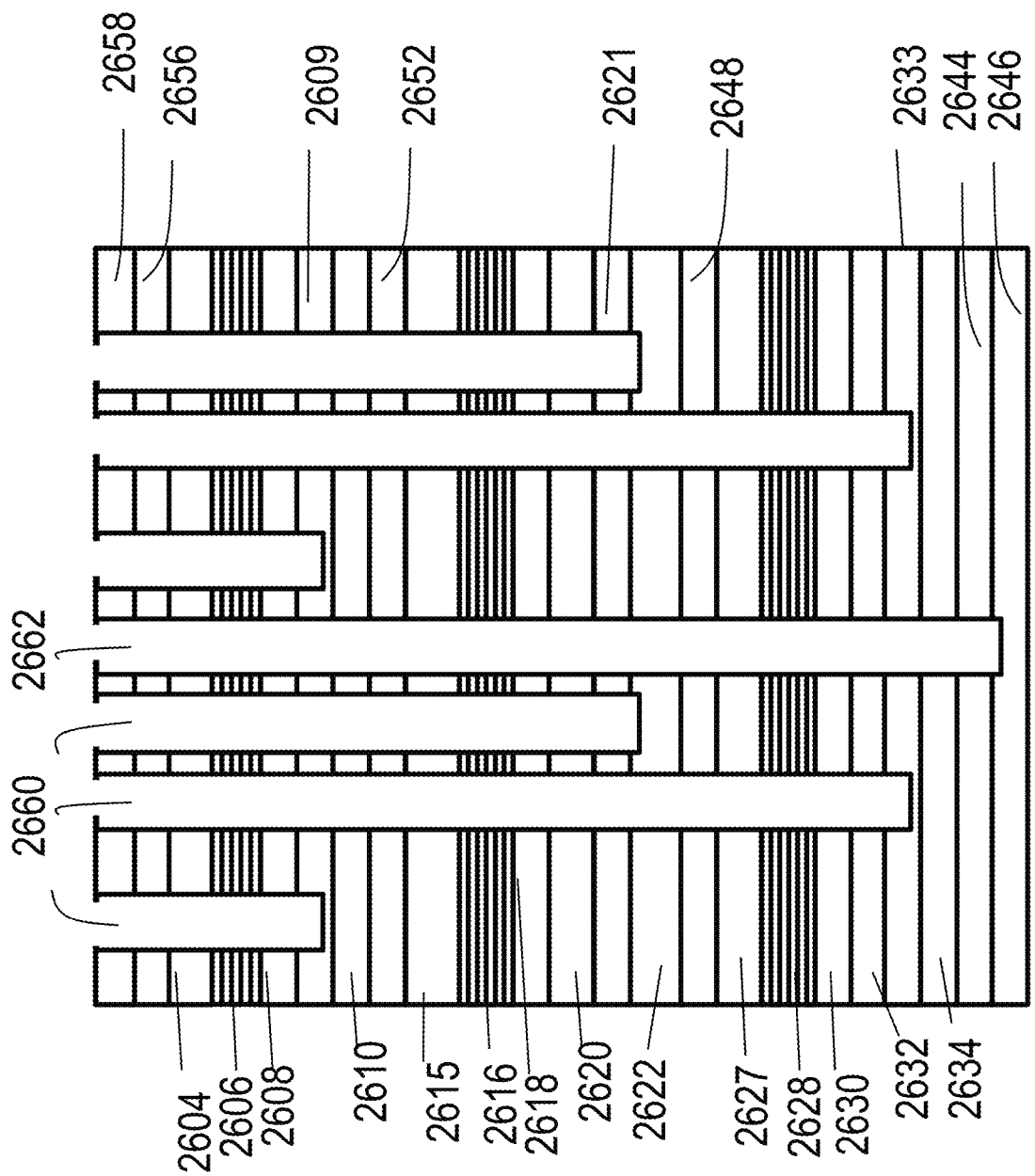
Figure 5C:
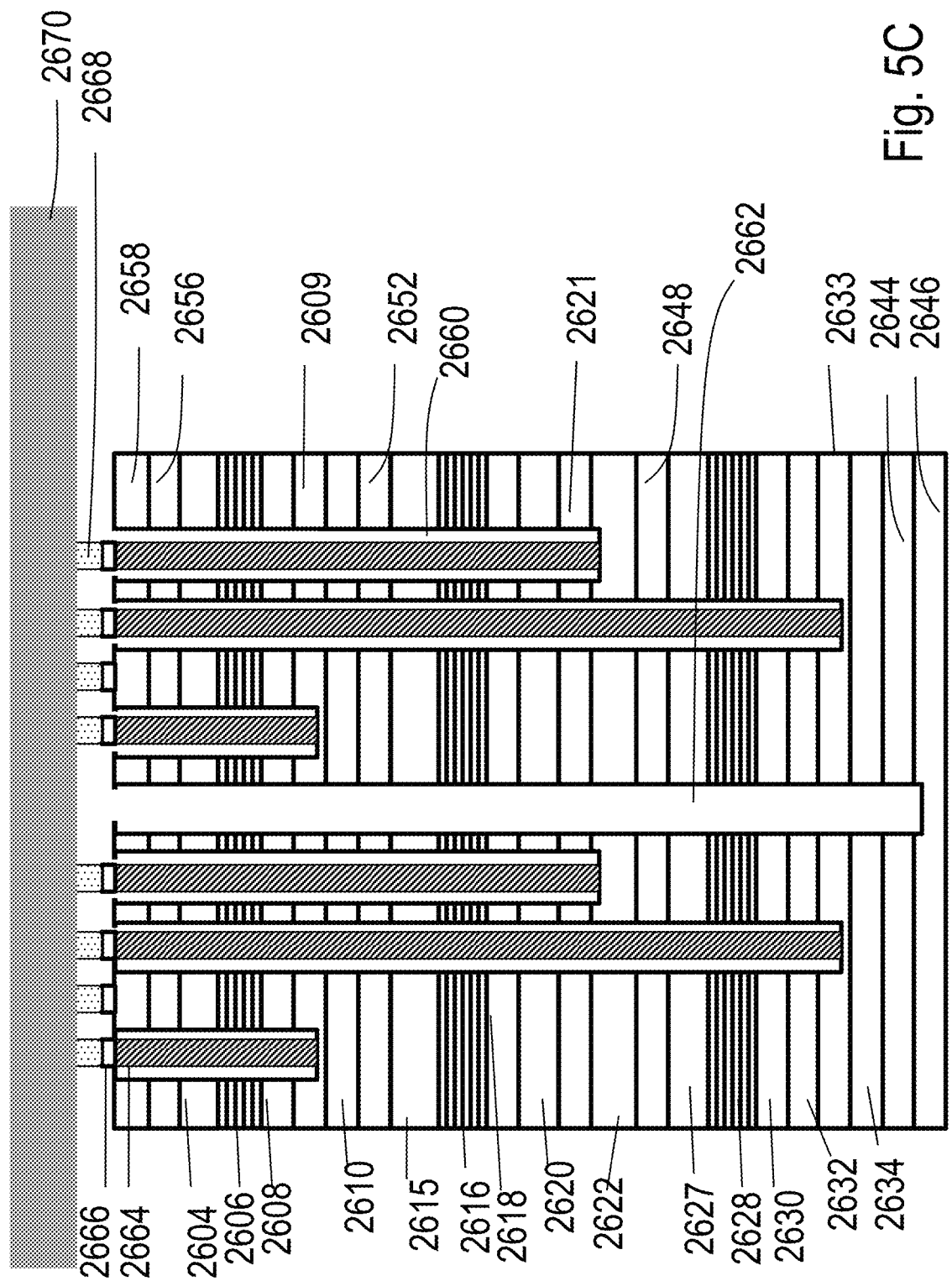

FIGS. 5A-5C illustrate an embodiment of this invention, where a microdisplay is constructed using stacked RGB LEDs and control circuits are connected to each pixel with solder bumps. This process could include several steps that occur in a sequence from Step (A) to Step (C). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 5A. Using procedures similar to FIG. 4A-4S of parent U.S. patent application Ser. No. 13/274,161 issued as U.S. Pat. No. 9,197,804, incorporated herein by reference, the structure shown in FIG. 5A is constructed. Various elements of FIG. 5A are as follows:

2646—a glass substrate,
2644—an oxide layer, could be a conductive oxide such as ITO,
2634—an oxide layer, could be a conductive oxide such as ITO
2633—a an optional reflector, could be a Distributed Bragg Reflector or some other type of reflector,
2632—a P-type confinement layer that is used for a Blue LED (One example of a material for this region is GaN),
2630—a buffer layer that is typically used for a Blue LED (One example of a material for this region is AlGaN),
2628—a multiple quantum well used for a Blue LED (One example of materials for this region are InGaN/GaN),
2627—a N-type confinement layer that is used for a Blue LED (One example of a material for this region is GaN).
2648—an oxide layer, may be preferably a conductive metal oxide such as ITO,
2622—an oxide layer, may be preferably a conductive metal oxide such as ITO,
2621—an optional reflector (for example, a Distributed Bragg Reflector),
2620—a P-type confinement layer that is used for a Green LED (One example of a material for this region is GaN),
2618—a buffer layer that is typically used for a Green LED (One example of a material for this region is AlGaN),
2616—a multiple quantum well used for a Green LED (One example of materials for this region are InGaN/GaN),
2615—a N-type confinement layer that is used for a Green LED (One example of a material for this region is GaN),
2652—an oxide layer, may be preferably a conductive metal oxide such as ITO,
2610—an oxide layer, may be preferably a conductive metal oxide such as ITO,
2609—an optional reflector (for example, a Distributed Bragg Reflector),
2608—a P-type confinement layer used for a Red LED (One example of a material for this region is AlInGaP),
2606—a multiple quantum well used for a Red LED (One example of materials for this region are AlInGaP/GaInP),
2604—a P-type confinement layer used for a Red LED (One example of a material for this region is AlInGaP),
2656—an oxide layer, may be preferably a transparent conductive metal oxide such as ITO, and
2658—a reflector (for example, aluminum or silver).

Step (B) is illustrated in FIG. 5B. Via holes 2662 are etched to the substrate layer 2646 to isolate different pixels in the microdisplay/display. Also, via holes 2660 are etched to make contacts to various layers of the stack. These via holes may be preferably not filled. An alternative is to fill the via holes with a compatible oxide and planarize the surface with CMP. Various elements in FIG. 5B such as 2646, 2644, 2634, 2633, 2632, 2630, 2628, 2627, 2648, 2622, 2621, 2620, 2618, 2616, 2615, 2652, 2610, 2609, 2608, 2606, 2604, 2656 and 2658 have been described previously.

Step (C) is illustrated in FIG. 5C. Using procedures similar to those described in respect to FIGS. 4A-4S of parent U.S. patent application Ser. No. 13/274,161 issued as U.S. Pat. No. 9,197,804, incorporated herein by reference, the via holes 2660 have contacts 2664 (for example, with Aluminum) made to them. Also, using procedures similar to those described in FIGS. 4A-4S, nickel layers 2666, solder layers 2668, and a silicon sub-mount 2670 with circuits integrated on them are constructed. The silicon sub-mount 2670 has transistors to control each pixel in the microdisplay/display. Various elements in FIG. 5C such as 2646, 2644, 2634, 2633, 2632, 2630, 2628, 2627, 2648, 2622, 2621, 2620, 2618, 2616, 2615, 2652, 2610, 2609, 2608, 2606, 2604, 2656, 2660, 2662, and 2658 have been described previously.

It can be seen that the structure shown in FIG. 5C can have each pixel emit a certain color of light by tuning the voltage given to the red, green and blue layers within each pixel. This microdisplay may be constructed using the ion-cut technology, a smart layer transfer technique.

FIGS. 6A-6D illustrate an embodiment of this invention, where a microdisplay is constructed using stacked RGB LEDs and control circuits are integrated with the RGB LED stack. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 6A:
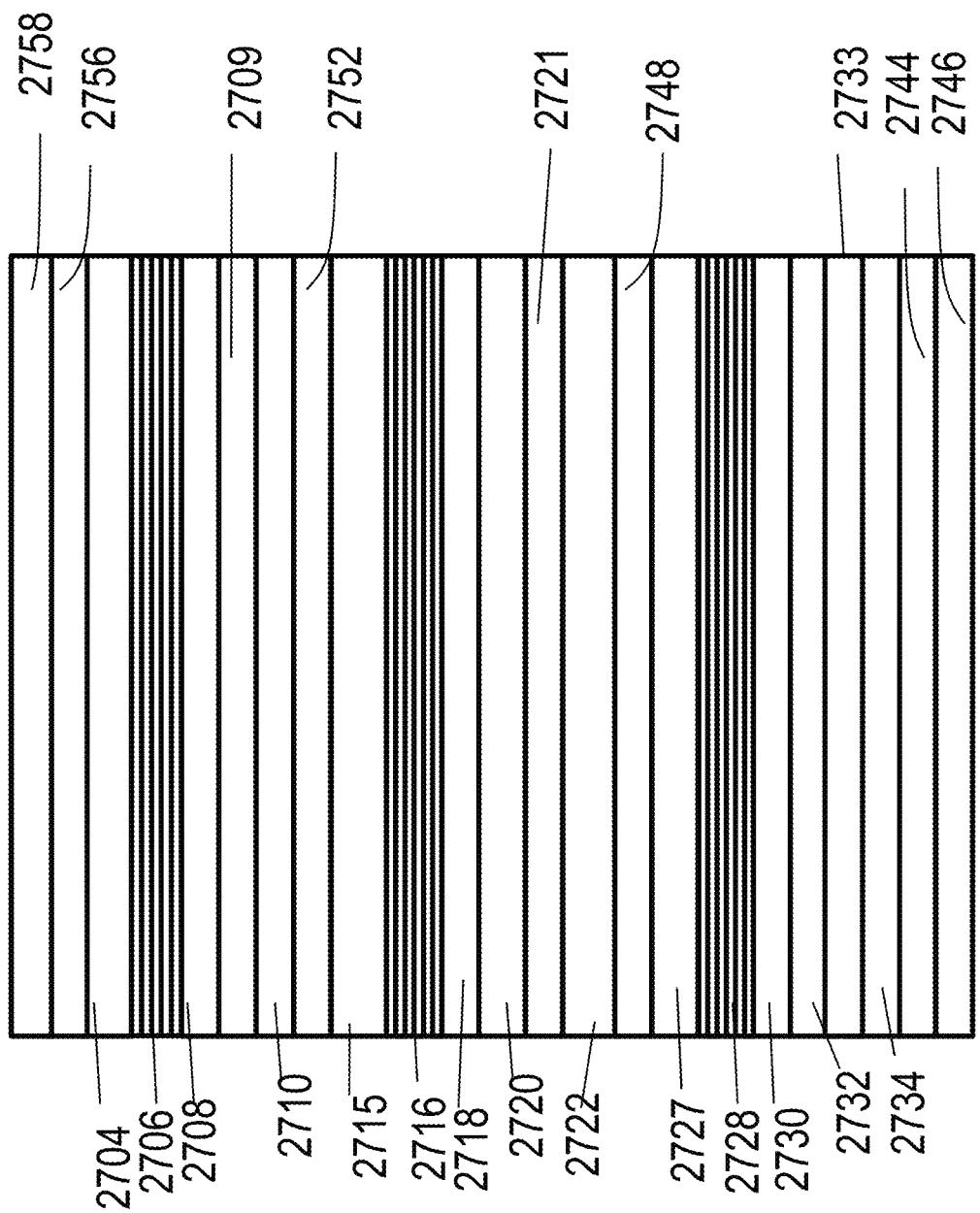
FIGS. 6A-6D are exemplary drawn illustrations of a microdisplay constructed using stacked RGB LEDs and control circuits are monolithically stacked above the LED.

Step (A) is illustrated in FIG. 6A. Using procedures similar to those illustrated in FIGS. 4A-4S of parent U.S. patent application Ser. No. 13/274,161 issued as U.S. Pat. No. 9,197,804, incorporated herein by reference, the structure shown in FIG. 6A is constructed. Various elements of FIG. 6A are as follows:

2746—a glass substrate,
2744—an oxide layer, could be a conductive oxide such as ITO,
2734—an oxide layer, could be a conductive oxide such as ITO,
2733—a an optional reflector (e.g., a Distributed Bragg Reflector or some other type of reflector),
2732—a P-type confinement layer that is used for a Blue LED (One example of a material for this region is GaN),
2730—a buffer layer that is typically used for a Blue LED (One example of a material for this region is AlGaN),
2728—a multiple quantum well used for a Blue LED (One example of materials for this region are InGaN/GaN),
2727—a N-type confinement layer that is used for a Blue LED (One example of a material for this region is GaN),
2748—an oxide layer, may be preferably a conductive metal oxide such as ITO,
2722—an oxide layer, may be preferably a conductive metal oxide such as ITO, 2721—an optional reflector (e.g., a Distributed Bragg Reflector), 2720—a P-type confinement layer that is used for a Green LED (One example of a material for this region is GaN), 2718—a buffer layer that is typically used for a Green LED (One example of a material for this region is AlGaN), 2716—a multiple quantum well used for a Green LED (One example of materials for this region are InGaN/GaN), 2715—a N-type confinement layer that is used for a Green LED (One example of a material for this region is GaN), 2752—an oxide layer, may be preferably a conductive metal oxide such as ITO, 2710—an oxide layer, may be preferably a conductive metal oxide such as ITO, 2709—an optional reflector (e.g., a Distributed Bragg Reflector), 2708—a P-type confinement layer used for a Red LED (One example of a material for this region is AlInGaP), 2706—a multiple quantum well used for a Red LED (One example of materials for this region are AlInGaP/GaInP), 2704—a P-type confinement layer used for a Red LED (One example of a material for this region is AlInGaP), 2756—an oxide layer, may be preferably a transparent conductive metal oxide such as ITO, 2758—a reflector (e.g., aluminum or silver).

Figure 6B:
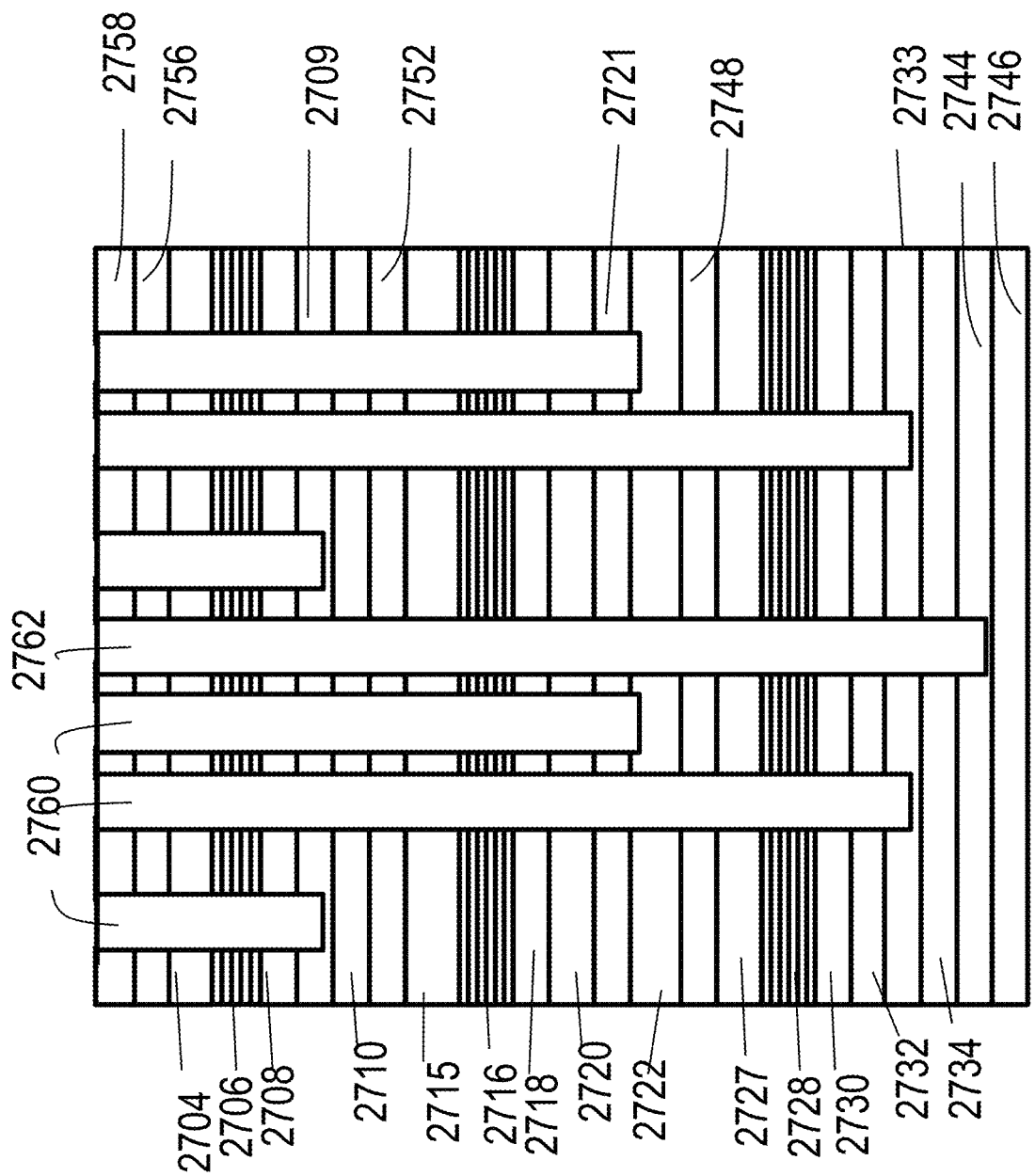

Step (B) is illustrated in FIG. 6B. Via holes 2762 are etched to the substrate layer 2746 to isolate different pixels in the microdisplay/display. Also, via holes 2760 are etched to make contacts to various layers of the stack. These via holes may be preferably filled with a compatible oxide and the surface can be planarized with CMP. Various elements of FIG. 6B such as 2746, 2744, 2734, 2733, 2732, 2730, 2728, 2727, 2748, 2722, 2721, 2720, 2718, 2716, 2715, 2752, 2710, 2709, 2708, 2706, 2704, 2756 and 2758 have been described previously.

Figure 6C:
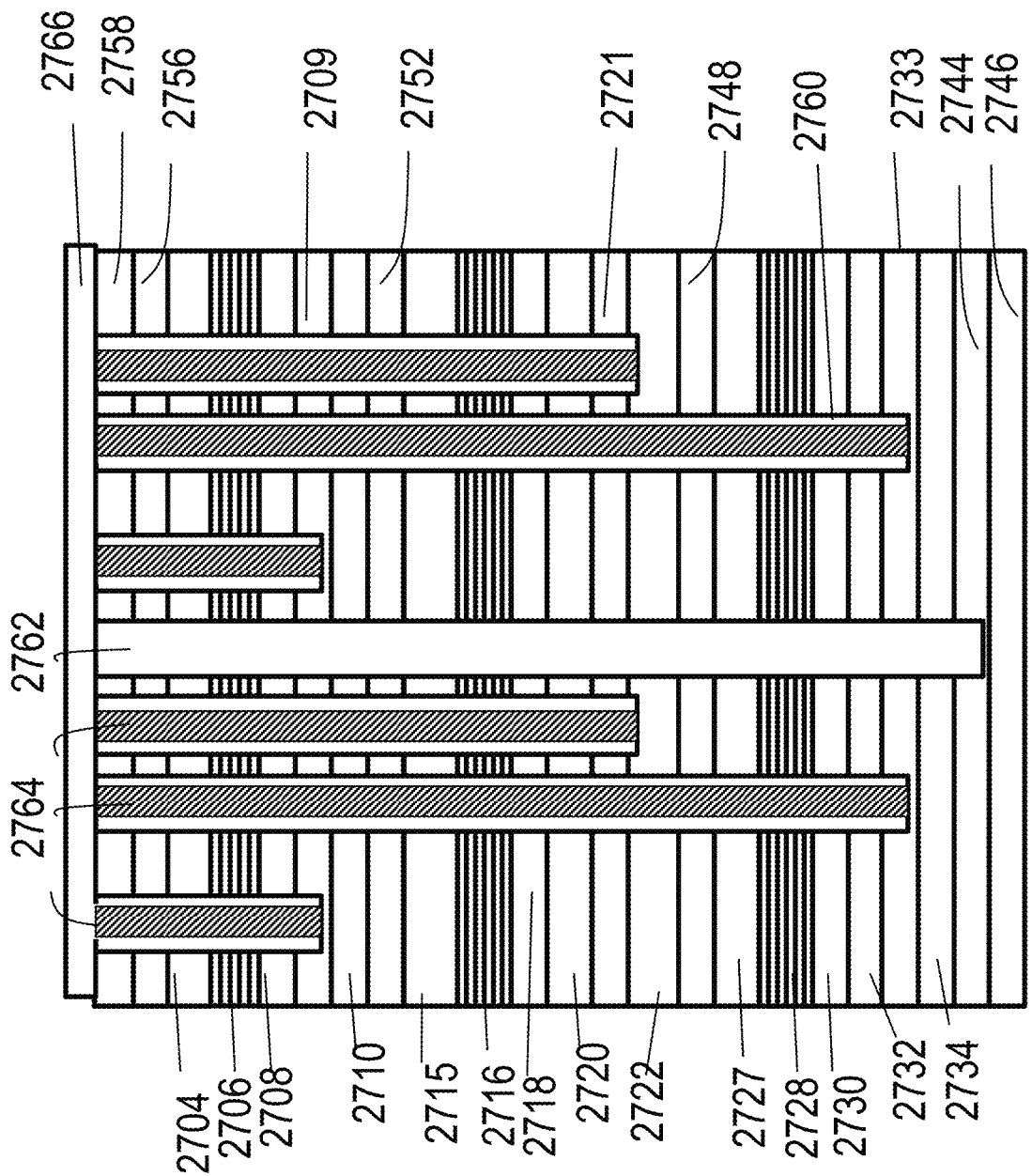

Step (C) is illustrated in FIG. 6C. Metal 2764 (for example) is constructed within the via holes 2760 using procedures similar to those described in respect to FIGS. 4A-4S of parent U.S. patent application Ser. No. 13/274,161 issued as U.S. Pat. No. 9,197,804, incorporated herein by reference. Following this construction, an oxide layer 2766 is deposited. Various elements of FIG. 6C such as 2746, 2744, 2734, 2733, 2732, 2730, 2728, 2727, 2748, 2722, 2721, 2720, 2718, 2716, 2715, 2752, 2710, 2709, 2708, 2706, 2704, 2756, 2760, 2762 and 2758 have been described previously.

Figure 6D:
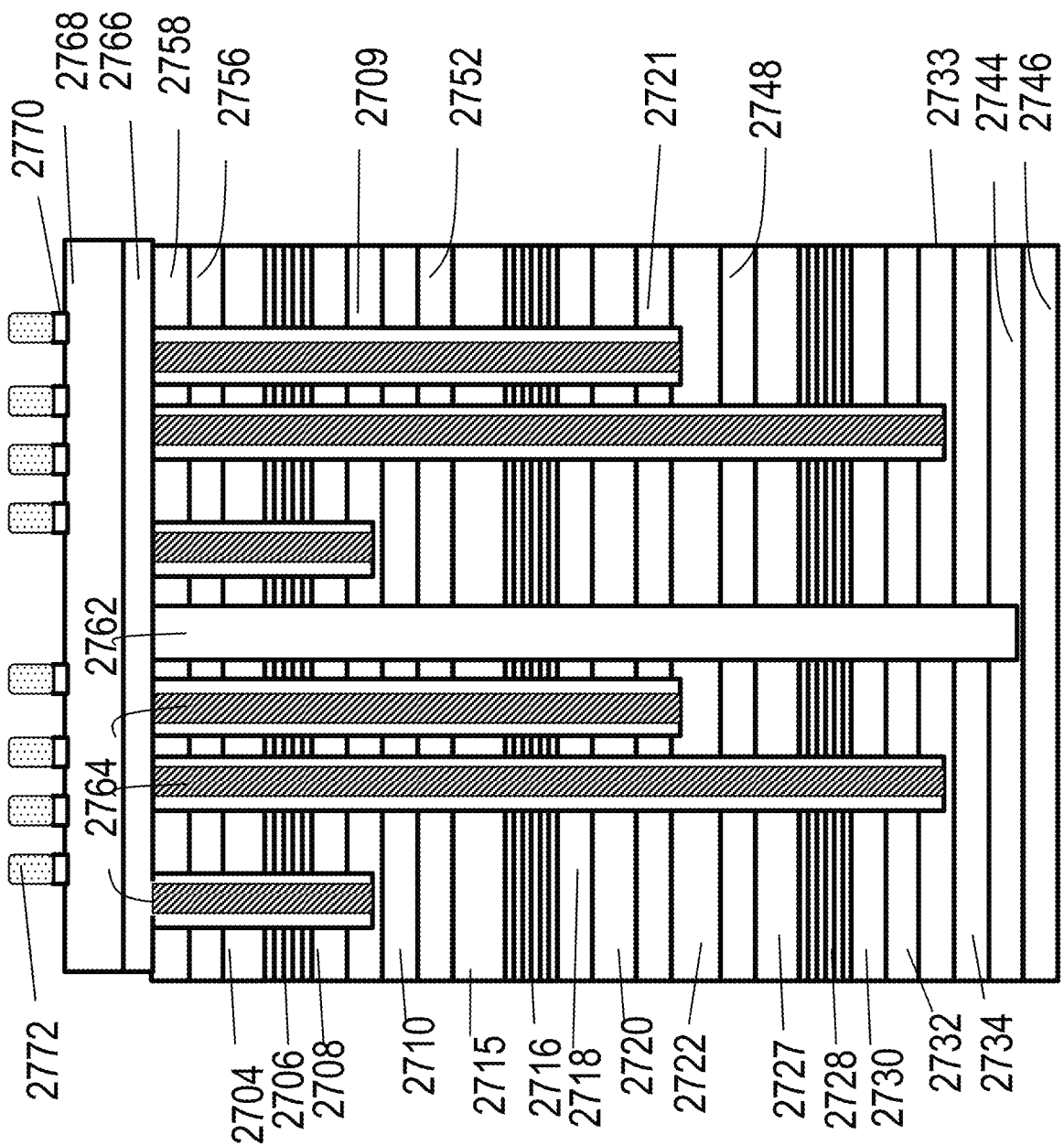

Step (D) is illustrated in FIG. 6D. Using procedures described in co-pending U.S. patent application Ser. No. 12/901,890, issued as U.S. Pat. No. 8,026,521, the entire contents of which is incorporated herein by reference, a single crystal silicon transistor layer 2768 can be monolithically integrated using ion-cut technology atop the structure shown in FIG. 6C. This transistor layer 2768 is connected to various contacts of the stacked LED layers (not shown in the figure for simplicity). Following this connection, nickel layer 2770 is constructed and solder layer 2772 is constructed. The packaging process then is conducted where the structure shown in FIG. 6D is connected to a silicon sub-mount. It can be seen that the structure shown in FIG. 6D can have each pixel emit a certain color of light by tuning the voltage given to the red, green and blue layers within each pixel. This microdisplay is constructed using the ion-cut technology, a smart layer transfer technique.

The embodiments of this invention described in FIGS. 5-6 may enable novel implementations of "smart-lighting concepts" (also known as visible light communications) that are described in "Switching LEDs on and off to enlighten wireless communications", EETimes, June 2010 by R. Colin Johnson. For these prior art smart lighting concepts, LED lights could be turned on and off faster than the eye can react, so signaling or communication of information with these LED lights is possible. An embodiment of this invention involves designing the displays/microdisplays described in FIGS. 5-6 to transmit information, by modulating wavelength of each pixel and frequency of switching each pixel on or off. One could thus transmit a high bandwidth through the visible light communication link compared to a LED, since each pixel could emit its own information stream, compared to just one information stream for a standard LED. The stacked RGB LED embodiment described in FIGS. 4A-4S of parent U.S. patent application Ser. No. 13/274,161 issued as U.S. Pat. No. 9,197,804, incorporated herein by reference, could also provide an improved smart-light than prior art since it allows wavelength tunability besides the ability to turn the LED on and off faster than the eye can react.

Several material systems have been illustrated as examples for various embodiments of this invention in this patent application. It will be clear to one skilled in the art based on the present disclosure that various other material systems and configurations can also be used without violating the concepts described. It will also be appreciated by persons of ordinary skill in the art that the present invention is not limited to what has been particularly shown and described hereinabove. Rather, the scope of the invention includes both combinations and sub-combinations of the various features described herein above as well as modifications and variations which would occur to such skilled persons upon reading the foregoing description. Thus the invention is to be limited only by the appended claims.

What is claimed is:

1. A 3D micro display, the 3D micro display comprising:
a first single crystal layer comprising at least one LED driving circuit;
a second single crystal layer comprising a first plurality of light emitting diodes (LEDs),
wherein said second single crystal layer overlays said first single crystal layer,
wherein said second single crystal layer comprises at least ten individual first LED pixels; and
a second plurality of light emitting diodes (LEDs),
wherein said second single crystal layer and said first single crystal layer are separated by a vertical distance of less than ten microns.

2. The 3D micro display according to claim 1,
wherein a plurality of said first LED pixels are individually driven by said driving circuit.

3. The 3D micro display according to claim 1, further comprising:
a top surface of said first single crystal layer; and
a bottom surface of said second single crystal layer,
wherein said vertical distance is the distance from said top surface of said first single crystal layer to said bottom surface of said second single crystal layer.

4. The 3D micro display according to claim 1, further comprising:
a third single crystal layer,
wherein said third single crystal layer overlays said second single crystal layer.

5. The 3D micro display according to claim 1,
wherein said first plurality of light emitting diodes (LEDs) emits a first light with a first wavelength, wherein said second plurality of light emitting diodes (LEDs) emits a second light with a second wavelength, and wherein said first wavelength and said second wavelength differ by more than 10 nm.

6. The 3D micro display according to claim 1, further comprising:
a third single crystal layer,
wherein said third single crystal layer comprises at least ten second LED pixels.

7. A 3D micro display, the 3D micro display comprising:
a first single crystal layer comprising at least one LED driving circuit;
a second single crystal layer comprising a first plurality of light emitting diodes (LEDs),
wherein said second single crystal layer overlays said first single crystal layer,
wherein said second single crystal layer comprises at least ten individual first LED pixels;
a second plurality of light emitting diodes (LEDs); and
a third single crystal layer,
wherein said third single crystal layer overlays said second single crystal layer.

8. The 3D micro display according to claim 7,
wherein a plurality of said first LED pixels are individually driven by said driving circuit.

9. The 3D micro display according to claim 7,
wherein said second single crystal layer and said first single crystal layer are separated by a vertical distance of less than ten microns.

10. The 3D micro display according to claim 7,
a top surface of said first single crystal layer; and
a bottom surface of said second single crystal layer,
wherein a vertical distance is a distance from said top surface of said first single crystal layer to said bottom surface of said second single crystal layer, and
wherein said vertical distance is less than ten microns.

11. The 3D micro display according to claim 7,
wherein said first plurality of light emitting diodes (LEDs) emits a first light with a first wavelength,
wherein said second plurality of light emitting diodes (LEDs) emits a second light with a second wavelength, and
wherein said first wavelength and said second wavelength differ by greater than 10 nm.

12. The 3D micro display according to claim 7,
wherein said third single crystal layer comprises at least ten individual second LED pixels.

13. The 3D micro display according to claim 7, further comprising:
a fourth single crystal layer,
wherein said fourth single crystal layer overlays said third single crystal layer.

14. A 3D micro display, the 3D micro display comprising:
a first single crystal layer comprising at least one LED driving circuit;
a second single crystal layer comprising a first plurality of light emitting diodes (LEDs),
wherein said second single crystal layer overlays said first single crystal layer,
wherein said second single crystal layer comprises at least ten individual first LED pixels; and
a second plurality of light emitting diodes (LEDs),
wherein said first plurality of light emitting diodes (LEDs) emits a first light with a first wavelength,
wherein said second plurality of light emitting diodes (LEDs) emits a second light with a second wavelength, and
wherein said first wavelength and said second wavelength differ by greater than 10 nm.

15. The 3D micro display according to claim 14,
wherein a plurality of said first LED pixels are individually driven by said driving circuit.

16. The 3D micro display according to claim 14,
wherein said second single crystal layer and said first single crystal layer are separated by a vertical distance of less than ten microns.

17. The 3D micro display according to claim 14, further comprising:
a top surface of said first single crystal layer; and
a bottom surface of said second single crystal layer,
wherein a vertical distance is a distance from said top surface of said first single crystal layer to said bottom surface of said second single crystal layer, and
wherein said vertical distance is less than ten microns.

18. The 3D micro display according to claim 14, further comprising:
a third plurality of light emitting diodes (LEDs),
wherein said third plurality of light emitting diodes (LED) emits a third light with a third wavelength, and
wherein said first wavelength and said second wavelength and said third wavelength differ by greater than 10 nm from each other.

19. The 3D micro display according to claim 14, further comprising:
a third single crystal layer,
wherein said third single crystal layer overlays said second single crystal layer, and
wherein said third single crystal layer comprises at least ten second LED pixels.

20. The 3D micro display according to claim 14, further comprising:
a third single crystal layer,
wherein said third single crystal layer overlays said second single crystal layer, and
wherein said third single crystal layer comprises at least ten second LED pixels; and
a fourth single crystal layer,
wherein said fourth single crystal layer overlays said third single crystal layer.

* * * * *